US011735234B2

(12) United States Patent
Vimercati et al.

(10) Patent No.: US 11,735,234 B2
(45) Date of Patent: Aug. 22, 2023

(54) DIFFERENTIAL AMPLIFIER SCHEMES FOR SENSING MEMORY CELLS

(71) Applicant: Micron Technology, Inc., Boise, ID (US)

(72) Inventors: Daniele Vimercati, El Dorado Hills, CA (US); Xinwei Guo, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/557,825

(22) Filed: Dec. 21, 2021

(65) Prior Publication Data

US 2022/0189514 A1 Jun. 16, 2022

Related U.S. Application Data

(63) Continuation of application No. 16/702,422, filed on Dec. 3, 2019, now Pat. No. 11,211,101.

(51) Int. Cl.
*G11C 27/02* (2006.01)
*G11C 7/06* (2006.01)
*H03F 3/45* (2006.01)
*G11C 11/16* (2006.01)
*G11C 11/15* (2006.01)

(52) U.S. Cl.
CPC .............. *G11C 7/062* (2013.01); *G11C 11/15* (2013.01); *G11C 11/1657* (2013.01); *H03F 3/45076* (2013.01)

(58) Field of Classification Search
CPC .................................................... G11C 27/026
See application file for complete search history.

(56) References Cited

U.S. PATENT DOCUMENTS

| 11,211,101 | B2 * | 12/2021 | Vimercati | G11C 11/2273 |
| 2005/0156219 | A1 * | 7/2005 | Chen | H01L 29/78 257/300 |
| 2006/0262621 | A1 * | 11/2006 | Forbes | G11C 7/065 365/205 |
| 2012/0300566 | A1 | 11/2012 | Mueller et al. | |
| 2015/0302914 | A1 | 10/2015 | Matsumoto et al. | |
| 2016/0064095 | A1 | 3/2016 | Kato et al. | |
| 2017/0162275 | A1 | 6/2017 | Gao et al. | |
| 2018/0019717 | A1 * | 1/2018 | Murashima | H03G 3/20 |
| 2019/0295641 | A1 * | 9/2019 | Conte | G11C 13/0004 |
| 2020/0105336 | A1 | 4/2020 | Jung et al. | |

* cited by examiner

*Primary Examiner* — Min Huang
(74) *Attorney, Agent, or Firm* — Holland & Hart LLP

(57) ABSTRACT

Methods, systems, and devices for differential amplifier schemes for sensing memory cells are described. In one example, an apparatus may include a memory cell, a differential amplifier having a first input node, a second input node, and an output node that is coupled with the first input node via a first capacitor, and a second capacitor coupled with the first input node. The apparatus may include a controller configured to cause the apparatus to bias the first capacitor, couple the memory cell with the first input node, and generate, at the output node, a sense signal based at least in part on biasing the first capacitor and coupling the memory cell with the first input node. The apparatus may also include a sense component configured to determine a logic state stored by the memory cell based at least in part on the sense signal.

16 Claims, 9 Drawing Sheets

DIFFERENTIAL AMPLIFIER SCHEMES FOR SENSING MEMORY CELLS

CROSS REFERENCE

The present Application for Patent is a continuation of U.S. patent application Ser. No. 16/702,422 by Vimercati et al., entitled "DIFFERENTIAL AMPLIFIER SCHEMES FOR SENSING MEMORY CELLS," filed Dec. 3, 2019, assigned to the assignee hereof, and is expressly incorporated by reference in its entirety herein.

BACKGROUND

The following relates generally to one or more memory systems and more specifically to differential amplifier schemes for sensing memory cells.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g. FeRAM, may maintain their stored logic state for extended periods of time even in the absence of an external power source. Volatile memory devices, e.g. DRAM, may lose their stored state when disconnected from an external power source. FeRAM may be able to achieve densities similar to volatile memory but may have non-volatile properties due to the use of a ferroelectric capacitor as a storage device.

Improving memory devices, may include increasing memory cell density, increasing read/write speeds, increasing reliability, increasing data retention, reducing power consumption, or reducing manufacturing costs, among other metrics. In some cases, various circuit components may be included between a memory cell and a sense amplifier to support developing a signal related to determining a logic state stored by a memory cell. Some such components may be associated with relatively high power consumption or charge leakage, which may adversely limit the performance of a memory device.

DETAILED DESCRIPTION

Figure 1:
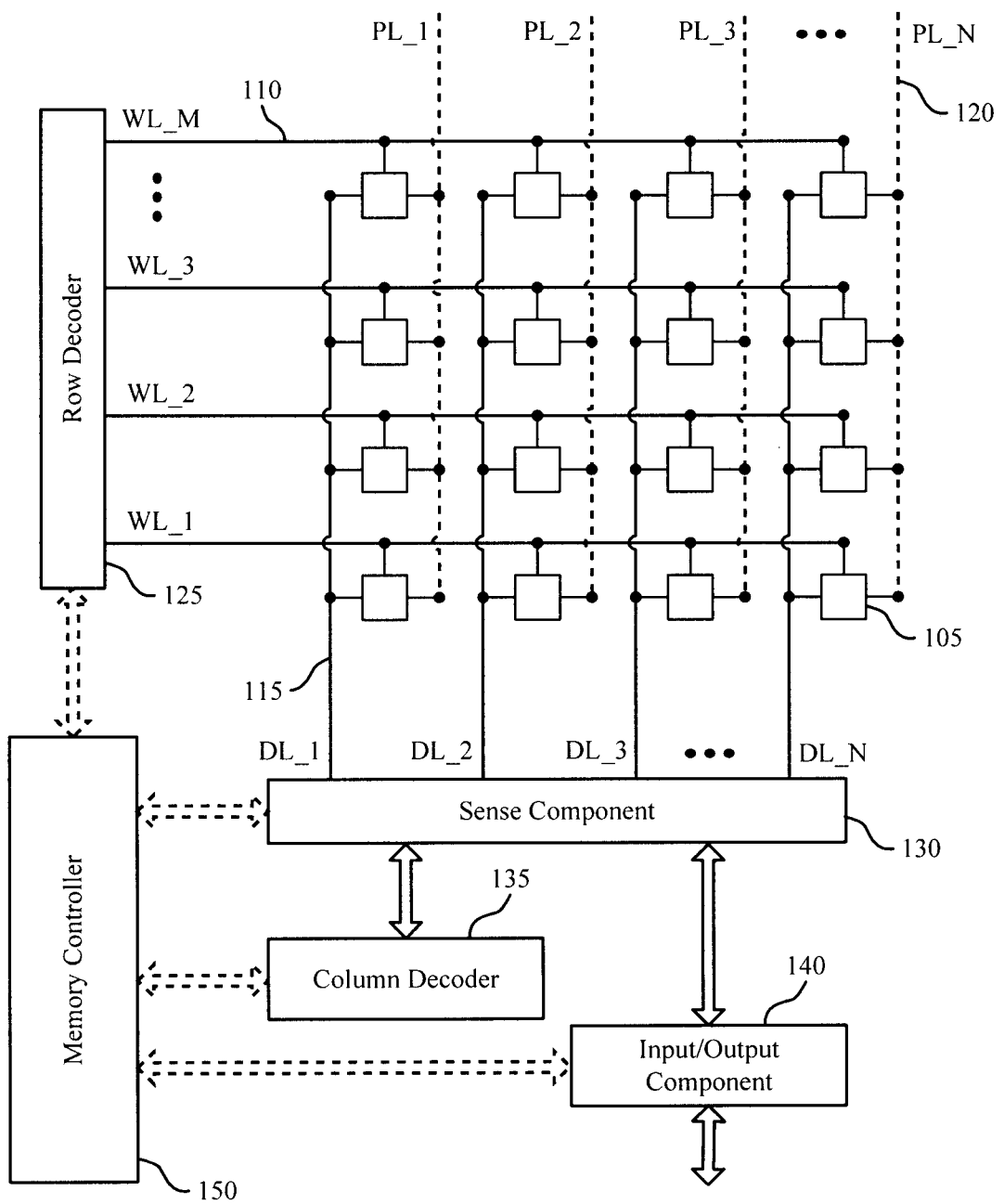
FIG. 1 illustrates an example of a memory device that supports differential amplifier schemes for sensing memory cells in accordance with examples as disclosed herein.

The logic state of a memory cell may be detected using a read operation that employs differential amplifier schemes for sensing one or more memory cells in accordance with examples disclosed herein. For example, a memory device may include an amplifier component coupled with or between a memory cell and a sense component. The amplifier component may include a differential amplifier, where a first input node of the differential amplifier may be configured to be coupled with the memory cell and an output node of the differential amplifier may be configured to be coupled with the sense component. In some examples, the differential amplifier may be configured such that a current at the output node is proportional to a difference in voltage between the first input node and a second input node (e.g., when configured as a transconductance differential amplifier).

In some examples, the amplifier component may include an integrator capacitor coupled with or between the first input node of the differential amplifier and the output node of the differential amplifier. For example, a first node of the integrator capacitor may be coupled or connected with the first input node of the deferential amplifier and a second node of the integrator capacitor may be coupled or connected with the output node of the differential amplifier. The gain of the amplifier component may be related to the capacitance of the integrator capacitor, and in some examples, an integrator capacitor having a non-linear capacitance may be used to provide a non-linear gain of the amplifier component. In some examples, the amplifier component may also provide a selectable direct feedback of the differential amplifier, where a switching component may be coupled with or between the output node turd the first input node, and may be configured to selectively connect or disconnect the output node and the first input node (e.g., providing a selectable direct feedback line or connection).

In some examples, the memory device may also include a reference capacitor (e.g. separate from the integrator capacitor) that is coupled with the first input node of the differential amplifier. For example, a first node of the reference capacitor may be coupled or connected with the first input node of the differential amplifier, and a second node of the reference capacitor may be configured to be coupled with a variable voltage source for precharging the reference capacitor. The second node of the reference capacitor may be selectively coupled with a first voltage (e.g., with a ground voltage source) or a second voltage (e.g., with a positive or precharging voltage source). In some cases, the reference capacitor may be precharged in a manner such that a charge stored in the reference capacitor as a result of the precharging is configured to be related to a charge that may be stored by accessed memory cells for different logic states.

During a read operation, the reference capacitor may be charged (e.g., in a precharge operation, in a biasing operation), and a memory cell may be coupled with the first input node of the differential amplifier. A voltage at the first input node of the differential amplifier after coupling the memory cell may be based at least in part on charge sharing between the reference capacitor and an access line associated with the first input node as well as a charge sharing between the memory cell and the access line associated with the first input node. Accordingly, the voltage at the first input node of the differential amplifier after the coupling may be based at least in part on a logic state (e.g., a charge suite) stored by the memory cell. Moreover, the voltage at the output node of the differential amplifier may be based at least in part on the voltage at the first input node (e.g., based at least in part on the described charge sharing), as well as the integrator capacitor that provides a capacitive feedback between the output node and the first input node. The output node of the differential amplifier may be coupled with a sense component, and the differential amplifier may provide a sense signal to the sense component that may be based at least in part on the logic state stored by the memory cell.

In some examples, the described amplifier schemes may provide for a reduction or elimination of charge sharing between a memory cell and a sense component, among other advantages. For example, current or charge may be provided by the described differential amplifier (e.g., via voltage supplies coupled with the differential amplifier), and the provided current or charge may be based at least in pan on voltage signals derived from accessing a memory cell. By reducing or eliminating charge sharing between a memory cell and a sense component, the performance of a memory device may be improved compared with memory devices that do not employ such techniques. Moreover, the described amplifier schemes may leverage different capacitors for reference signal generation and for setting an amplifier gain, which may decouple design tradeoffs that may be relevant to other signal development circuitry designs.

Features of the disclosure are initially described in the context of memory systems and circuitry as described with reference to FIGS. 1-3. Features of the disclosure are described in further detail in the context of specific circuitry and timing diagrams with reference to FIGS. 5-7. These and other features of the disclosure are further illustrated by and described with reference to an apparatus diagram and flow-charts that relate to differential amplifier schemes for sensing memory cells as described with references to FIGS. 8 and 9.

FIG. 1 illustrates an example memory device 100 that supports differential amplifier schemes for sensing memory cells in accordance with examples as disclosed herein. The memory device 100 may also be referred to as an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states. In various examples, the memory cells 105 may include a capacitive memory element, a ferroelectric memory element, a resistive element, or a self-selecting memory (e.g., SSM) element.

In some examples, a memory cell 105 may store an electric charge representative of the programmable logic states (e.g., storing charge in a capacitor). In one example, a charged and uncharged capacitor may represent two logic states, respectively. In another example, a positively and negatively charged capacitor may represent two logic states, respectively. DRAM or FeRAM architectures may use such designs, and the capacitor employed may include a dielectric material with linear or para-electric electric polarization properties as an insulator. In some examples, different levels of charge of a capacitor may represent different logic states (e.g., supporting more than two logic states in a respective memory cell 105). In some examples, such as FeRAM architectures, a memory cell 105 may include a ferroelectric capacitor having a ferroelectric material as an insulating layer between terminals of the capacitor. Different levels of polarization of a ferroelectric capacitor may represent different logic states (e.g., supporting two or more logic states in a respective memory cell 105). Ferroelectric materials have non-linear polarization properties including those discussed in further detail with reference to FIG. 3.

In some examples, a memory cell 135 may include a material portion, which may be referred to as a memory element, a memory storage element, a self-selecting memory element, or a self-selecting memory storage element. The material portion may have a variable and configurable electrical resistance or thresholding characteristic that is representative of different logic states.

For example, a material that can take the form of a crystalline atomic configuration or an amorphous atomic configuration (e.g., able to maintain either a crystalline state or an amorphous state over an ambient operating temperature range of the memory device 100) may have different electrical resistances depending on the atomic configuration. A more-crystalline state of the material (e.g., a single crystal, a collection of a relatively large crystal grains that is substantially crystalline) may have a relatively low electrical resistance, and may alternatively be referred to as a "SET" logic state. A more-amorphous state of the material (e.g., an entirely amorphous state, some distribution of relatively small crystal grains that is substantially amorphous) may have a relatively high electrical resistance, and may alternatively be referred to as a 'RESET' logic state. Thus, a voltage applied to such a memory cell 105 may result in different current flow depending on whether the material portion of the memory cell 105 is in the more-crystalline or the more-amorphous state. Accordingly, the magnitude of the current resulting from applying a read voltage to the memory cell 105 may be used to determine a logic state stored by memory cell 105.

In some examples, a memory element may be configured with various ratios of crystalline and amorphous areas (e.g., varying degrees of atomic order and disorder) that may result in intermediate resistances, which may represent different logic states (e.g., supporting two or more logic states in a respective memory cell 105). Further, in some examples, a material or a memory element may have more than two atomic configurations, such as an amorphous configuration and two different crystalline configurations. Although described herein with reference to an electrical resistance of different atomic configurations, a memory device may use some other characteristic of a memory element to determine a stored logic state corresponding to an atomic configuration, or combination of atomic configurations.

In some cases, a memory element in a more-amorphous state may be associated with a threshold voltage, where electrical current flows through the memory element when the threshold voltage is exceed across the memory element. When a voltage applied across the memory element in the more-amorphous state is less than the threshold voltage, current may not flow through the memory element. In some cases, a memory element in the more-crystalline state may not be associated with a threshold voltage (e.g., may be associated with a threshold voltage of zero), and a current may flow through the memory element in response to a non-zero voltage across the memory element. In some cases, a material in both the more-amorphous state and the more-crystalline state may be associated with threshold voltages. For example, SSM may enhance differences in a threshold voltage of the memory cell between different programmed states (e.g., by way of different compositional distributions). The logic state of a memory cell 105 basing such a memory element may be set by heating, the memory element to a temperature profile over time that supports forming a particular atomic configuration, or combination of atomic configurations.

A memory device 100 may include a three-dimensional (3D) memory array, where a plurality of two-dimensional (2D) memory arrays (e.g., decks, levels) are formed on top of one another. Such an arrangement may increase the number of memory cells 105 that may be placed or created on a single die or substrate as compared with 2D arrays, which in turn may reduce production costs or increase the performance of a memory device 100, or both. The decks may be separated by an electrically insulating material. Each deck or level may be aligned or positioned so that memory cells 105 may be approximately aligned with one another across each deck, forming a stack of memory cells 105.

In the example of memory device 100, each row of memory cells 105 is coupled with one of a plurality of first access lines 110 (e.g., a word line (WL), such as one of WL_1 through WL_M), and each column of memory cells 105 is coupled with one of a plurality of second access lines 115 (e.g., a digit line (DL), such as one of DL_1 through DL_N). In some cases, first access lines 110 and second access lines 115 may be substantially perpendicular to one another in the memory device 100 (e.g., when viewing a plane of a deck of the memory device 100, as shown in FIG. 1). References to word lines and bit lines, or their analogues, are interchangeable without loss of understanding or operation.

In general, one memory cell 105 may be located at the intersection of (e.g., coupled with, coupled between) an access line 110 and an access line 115. This intersection may be referred to as an address of a memory cell 105. A target memory cell 105 may be a memory cell 105 located at the intersection of an energized or otherwise selected access line 110 and an energized or otherwise selected access fine 115. In other words, an access line 110 and an access fine 115 may be energized or otherwise selected to access (e.g. read, write) a memory cell 105 at their intersection. Other memory cells 105 that are in electronic communication with (e.g. connected to) the same access line 110 or 115 may be referred to as untargeted memory cells 105.

Although the access lines described with reference to FIG. 1 are shown as direct fines between memory cells 105 and coupled components, access lines may include other circuit elements, such as capacitors, resistors, transistors, amplifiers, voltage sources, switching components, selection components, and others which may be used to support access operations including those described herein. In some examples, an electrode may be coupled with (e.g., between) a memory cell 105 and an access line 110, or with (e.g., between) a memory cell 105 and an access line 115. The term electrode may refer to an electrical conductor, or other electrical interface between components, and in some cases, may be employed as an electrical contact to a memory cell 105. An electrode may include a trace, wire, conductive line, conductive layer, conductive pad, or the like, that pros ides a conductive path between elements or components of memory device 100.

In some architectures, the logic storing component (e.g., a capacitive memory element a ferroelectric memory element, a resistive memory element, other memory element) of a memory cell 105 may be electrically isolated from a second access line 115 by a cell selection component. A first access line 110 may be coupled with and may control the cell selection component of the memory cell 105. For example, the cell selection component may be a transistor and the first access line 110 may be coupled with a gate of the transistor. Activating the first access line 110 of a memory cell 105 may result in an electrical connection or closed circuit between the logic storing component of the memory cell 105 and its corresponding second access line 115. The second access line 115 may then be accessed to read or write the memory cell 105.

In some examples, memory cells 105 may also be coupled with one of a plurality of third access lines 120 (e.g., a plate line (PL), such as one of PL_1 through PL_N). In some examples, the plurality of third access lines 120 may couple memory cells 105 with one or more voltage sources for various sensing and/or writing operations including those described herein. For example, when a memory cell 105 employs a capacitor for storing a logic state, a second access line 115 may provide access to a first terminal of the capacitor, and a third access line 120 may provide access to a second terminal of the capacitor (e.g., a terminal associated with an opposite plate of the capacitor as opposed to the first terminal of the capacitor, a terminal otherwise on the opposite side of a capacitance from the first terminal of the capacitor). Although the plurality of third access lines 120 of the memory device 100 are shown as substantially parallel with the plurality of second access lines 115, in other examples a plurality of third access lines 120 may be substantially parallel with the plurality of first access lines 110, or in any other configuration.

Access operations such as reading, writing, and rewriting may be performed on a memory cell 105 by activating or selecting a first access line 110, a second access line 115, and/or a third access line 120 coupled with the memory cell 105, which may include applying a voltage, a charge, or a current to the respective access line. Access lines 110, 115, and 120 may be made of conductive materials, such as metals (e.g., copper (Cu), silver (Ag), aluminum (Al), gold (Au), tungsten (W), titanium (Ti)), metal alloys, carbon, or other conductive or semi-conductive materials, alloys, or compounds. Upon selecting a memory cell 105, a resulting signal may be used to determine the stored logic state. For example, a memory cell 105 with a capacitive memory element storing a logic state may be selected, and the resulting flow of charge via an access line (e.g. charge sharing) and/or resulting voltage of an access line may be detected to determine the programmed logic state stored by the memory cell 105.

Accessing memory cells 105 may be controlled through a row decoder 125 and a column decoder 135. For example, a row decoder 125 may receive a row address from the memory controller 150 and activate the appropriate first access line 110 based at least in part on the received row address. Similarly, a column decoder 135 may receive a column address from the memory controller 150 and activate the appropriate second access line 115. Thus, in some examples, a memory cell 105 may be accessed by activating a first access line 110 and a second access line 115.

In some examples, the memory controller 150 may control the operation (e.g., read operations, write operations, rewrite operations, refresh operations, discharge operations) of memory cells 105 through the various components (e.g., row decoder 125, column decoder 135, sense component 130). In some cases, one or more of the row decoder 125, column decoder 135, and sense component 130 may be co-located or otherwise included with the memory controller 150. The memory controller 150 may generate row and column address signals to activate a desired access line 110 and access line 115. The memory controller 150 may also generate or control various voltages or currents used during the operation of memory device 100. For example, the memory controller 150 may apply a discharge voltage to an access line 110 or an access line 115 after accessing one or more memory cells 105.

In general, the amplitude, shape, or duration of an applied voltage, current, or charge may be adjusted or varied, and may be different for the various operations discussed in operating the memory device 100. Further, one, multiple, or all memory cells 105 within memory device 100 may be accessed simultaneously. For example, multiple or all memory cells 105 of memory device 100 may be accessed simultaneously during a reset operation in which all memory cells 105, or a group oi memory cells 105, are set to a single logic state.

A memory cell 105 may be read (e.g., sensed) by a sense component 130 when the memory cell 105 is accessed (e.g., in cooperation with the memory controller 150) to determine a logic state stored by the memory cell 105. For example, the sense component 130 may be configured to sense a current or charge through the memory cell 105, or a voltage resulting from coupling the memory cell 105 with the sense component 130 or other intervening component (e.g. a signal development circuit between the memory cell and the sense component 130), responsive to a read operation. The sense component 130 may provide an output signal indicative of the logic state stored by the memory cell 105 to one or more components (e.g., to the column decoder 135, the input/output component 140, the memory controller 150).

In some examples, after accessing the memory cell 105, the logic storage portion of memory cell 105 may discharge, or otherwise permit electrical charge or current to How via its corresponding access line 115. Such charge or current may result from biasing, or applying a voltage, to the memory cell 105 from one or more voltage sources or supplies (not shown) of the memory device 100, where such voltage sources or supplies may be part of the sense component 130, the memory controller 150, or some other component (e.g., a biasing component). In some examples, a discharge of a memory cell 105 may cause a change in the voltage of the access line 115, which the sense component 130 may compare to a reference voltage to determine the stored state of the memory cell 105. In some examples, a voltage may be applied to a memory cell 105 (e.g., using the corresponding access line 115 or access line 120) and the presence of a resulting current may depend on the applied voltage and the resistance state of a memory element of the memory cell 105, which the sense component 130 may use to determine the stored state of the memory cell 105.

In some examples, when a lead pulse (e.g., a lead voltage) is applied across a memory cell 105 with a memory element storing a first logic state (e.g., a SET state, associated with a more-crystalline atomic configuration), the memory cell conducts current due to the read pulse exceeding a threshold voltage of the memory cell 105. In response or based on this, the sense component 130 may therefore detect a current through the memory cell 105 as part of determining the stored logic state. When a read pulse is applied to the memory cell 105 with the memory element storing a second logic state (e.g., a RESET state, associated with an more-amorphous atomic configuration), which may occur before or after the application of a read pulse across a memory cell 105 with a memory element storing a first logic state, the memory cell 105 may not conduct current due to the read pulse not exceeding the threshold voltage of the memory cell. The sense component 130 may therefore detect little or no current through the memory cell 105 as pan of determining the stored logic state.

In some examples, a threshold current may be defined for sensing the logic state stored by a memory cell 105. The threshold current may be set above a current that may pass through the memory cell 105 when the memory cell 105 does not threshold in response to the read pulse, but equal to or below an expected current through the memory cell 105 when the memory cell 105 docs threshold in response to the read pulse. For example, the threshold current may be higher than a leakage current of the associated access lines 110 or 115. In some examples, a logic state stored by a memory cell 105 may be determined based on a voltage (e.g., across a shunt resistance) resulting from the current driven by a read pulse. For example, the resulting voltage may be compared relative to a reference voltage, with a resulting voltage less than the reference voltage corresponding to a first logic state and a resulting voltage greater than the reference voltage corresponding to a second logic state.

In some examples, more than one voltage may be applied when reading a memory cell 105 (e.g., multiple voltages may be applied as part of a read operation). For example, if an applied read voltage does not result in current flow, one or more other read voltages may be applied (e.g., until a current is detected by sense component 130). Based on assessing the read voltage that resulted in current flow, the stored logic state of the memory cell 105 may be determined. In some cases, a read voltage may be ramped (e.g., smoothly increasing higher in magnitude) until a current flow or other condition is detected by a sense component 130. In other cases, predetermined read voltages may be applied (e.g., a predetermined sequence of read voltages that increase higher in magnitude in a stepwise manner) until a current is detected. Likewise, a read current may be applied to a memory cell 105 and the magnitude of the voltage to create the read current may depend on the electrical resistance or the total threshold voltage of the memory cell 105.

A sense component 130 may include various switching components, selection components, transistors, amplifiers, capacitors, resistors, or voltage sources to detect and amplify a difference in sensing signals (e.g., a difference between a read voltage and a reference voltage, a difference between a read current and a reference current, a difference between a read charge and a reference charge), which, in some examples, may be referred to as latching. In some examples, a sense component 130 may include a collection of components (e.g., circuit elements) that may be repeated for each of a set of access lines 115 connected to the sense component 130. For example, a sense component 130 may include a separate sensing circuit (e.g., a separate sense amplifier, a separate signal development circuit) for each of a set of access lines 115 coupled with the sense component 130, such that a logic state may be separately detected for a respective memory cell 105 coupled with a respective one of the set of access lines 115. In various examples, a reference signal source or generated reference signal may be shared between components of the memory device 100 (e.g., shared among one or more sense components 130, shared among separate sensing circuits of a sense component 130).

The sense component 130 may be included in a device that includes the memory device 100. For example, the sense component 130 may be included with other read and write circuits, decoding circuits, or register circuits of the memory that may be coupled to the memory device 100. In some examples, the detected logic state of a memory cell 105 may be output through a column decoder 135 or an input/output component 140 as an output. In some examples, a sense component 130 may be part of a column decoder 135 or a row decoder 125. In some examples, a sense component 130 may be connected to or otherwise in electronic communication with a column decoder 135 or a row decoder 125.

In some memory architectures, accessing the memory cell 105 may degrade or destroy the stored logic state and re-write or refresh operations may be performed to return the original logic state to memory cell 105. In DRAM or FeRAM for example, a capacitor of a memory cell 105 may be partially or completely discharged during a sense operation, thereby corrupting the logic state that was stored in the memory cell 105. In PCM, for example, sense operations may cause a change to the atomic configuration of a memory cell 105, thereby changing the resistance state or thresholding characteristics of the memory cell 105. Thus, in some examples, the logic state stored in a memory cell 105 may be rewritten after an access operation. Further, activating a single access line 110 or 115 may result in the discharge of all memory cells 105 coupled with the access line 110 or 115. Thus, several or all memory cells 105 coupled with an access line 110 or 115 of an access operation (e.g., all cells of an accessed row, all cells of an accessed column) may be rewritten after the access operation.

In some examples, reading a memory cell 105 may be non-destructive. That is, the logic state of the memory cell 105 may not need to be rewritten after the memory cell 105 is read. For example, in nonvolatile memory such as PCM, accessing the memory cell 105 may not destroy the logic state and, thus, the memory cell 105 may not require rewriting after accessing. However, in various examples, refreshing the logic state of the memory cell 105 may or may not be needed in the absence of access operations. For example, the logic state stored by a memory cell 105 may be refreshed at periodic intervals by applying an appropriate write or refresh pulse to maintain the stored logic state. Refreshing the memory cell 105 may reduce or eliminate read disturb errors or logic state corruption due to a charge leakage or a change in an atomic configuration of a memory element over time.

A memory cell 105 may also be set, or written, by activating the relevant first access line 110, second access line 115, and/or third access line 120. In other words, a logic state may be stored in the memory cell 105. Column decoder 135 or row decoder 125 may accept data, for example via input/output component 140, to be written to the memory cells 105. In various examples, a write operation may be performed at least in part by a sense component 130, or a write operation may be configured to bypass a sense component 130.

In the case of a capacitive memory dement, a memory cell 105 may be written by applying a voltage to the capacitor, and then isolating the capacitor (e.g., isolating the capacitor from a voltage source used to write the memory cell 105) to store a charge in the capacitor associated with a desired logic state. In the case of ferroelectric memory, a ferroelectric memory element (e.g., a ferroelectric capacitor) of a memory cell 105 may written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage may be applied across the ferroelectric memory element (e.g., grounding, virtually grounding the ferroelectric memory element). In the case of PCM, a memory element may be written by applying a current with a profile that causes (e.g., by way of heating and cooling) the memory element to form an atomic configuration associated with a desired logic state.

In accordance with examples disclosed herein, an amplifier component (not shown) may be provided, such as an amplifier component in a signal development circuit between a memory cell 105 and a sense component 130, or a signal development portion of a sense component 130, to support the generation of sensing signals used to determine a logic state stored by a memory cell 105. In some examples, amplifier schemes may provide for a reduction or elimination of charge sharing between a memory cell and a sense component, among other advantages. By reducing or eliminating charge sharing between a memory cell and a sense component, the performance of a memory device may be improved compared with memory devices that do not employ such techniques. Moreover, the described amplifier schemes may leverage different capacitors for reference signal generation and for setting an amplifier gain, which may decouple design tradeoffs that may be relevant to other signal development circuitry designs.

Figure 2:
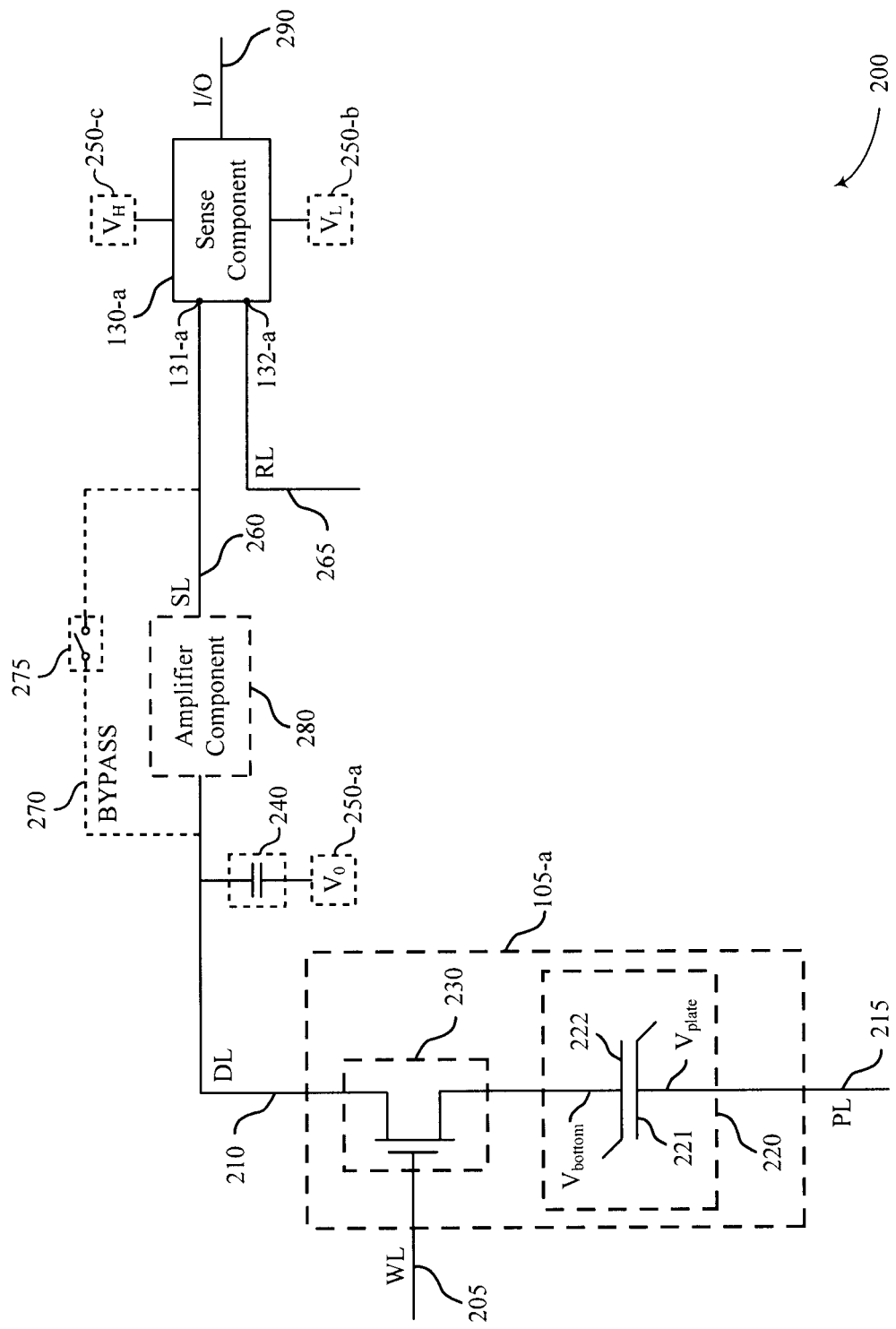
FIG. 2 illustrates an example of a circuit that supports differential amplifier schemes for sensing memory cells in accordance with examples as disclosed herein.

FIG. 2 illustrates an example circuit 200 that supports differential amplifier schemes for sensing memory cells in accordance with examples as disclosed herein. Circuit 200 may include a memory cell 105-a and a sense component 130-a, which may be examples of a memory cell 105 and a sense component 130 described with reference to FIG. 1. Circuit 200 may also include a word line 205, a digit line 210, and a plate line 215, which, in some examples, may correspond to a first access line 110, a second access line 115, and a third access line 120, respectively, as described with reference to FIG. 1. The circuit 200 may also include a reference line 265 used by the sense component 130-a a to determine a stored logic state of the memory cell 105-a.

As illustrated in FIG. 2, the sense component 130-a may include a first node 131-a and a second node 132-a, which in various examples may be coupled with different access lines of a circuit (e.g., a signal line 260 and a reference line 265 of circuit 200, respectively) or a common access line of a different circuit (not shown). However, other configurations of access lines and/or reference lines are possible in accordance with various examples as disclosed herein.

Memory cell 105-a may include a logic storage component (e.g., a memory element), such as capacitor 220 that has a first plate, cell plate 221, and a second plate, cell bottom 222. The cell plate 221 and the cell bottom 222 may be capacitively coupled through a dielectric material positioned between them (e.g., in a DRAM application), or capacitively coupled through a ferroelectric material positioned between them (e.g., in a FeRAM application). The cell plate 221 may be associated with a voltage $V_{plate}$, and cell bottom 222 may be associated with a voltage $V_{bottom}$, as illustrated in the circuit 200. The orientation of cell plate 221 and cell bottom 222 may be different (e.g., flipped) without changing the operation of the memory cell 105-a. The cell plate 221 may be accessed via the plate line 215 and cell bottom 222 may be accessed via the digit line 210. As described herein, various states may be stored by charging, discharging, and or polarizing the capacitor 220.

The capacitor 220 may be electrically connected with the digit line 210, and the stored logic state of capacitor 220 may be read or sensed by operating various elements represented in circuit 200. For example, the memory cell 105-a may also include a cell selection component 230 which, in some examples, may be referred to as a switching component or a selector device coupled with or between an access line (e.g., the digit line 210) and the capacitor 220. In some examples, a cell selection component 230 may be considered to be outside the illustrative boundary of the memory cell 105-a, and the cell selection component 230 may be referred to as a switching component or selector device coupled with or between an access line (e.g., the digit line 210) and the memory cell 105-a. The capacitor 220 can be coupled with digit line 210 when cell selection component 230 is activated (e.g., by way of an activating logical signal), and the capacitor 220 can be isolated from digit line 210 when cell selection component 230 is deactivated (e.g., by way of a deactivating logical signal).

Activating the cell selection component 230 may be referred to as selecting the memory cell 105-a in some examples, and deactivating the cell selection component 230 may be referred to as deselecting the memory cell 105-a in some examples. In some examples, the cell selection component 230 is a transistor and us operation is controlled by applying an activation voltage to the transistor gate, where the voltage for activating the transistor (e.g., the voltage between the transistor gate terminal and the transistor source terminal) is greater than the threshold voltage magnitude of the transistor. The word line 205 may be used to activate the cell selection component 230. For example, a selection voltage applied to the word line 205 (e.g., a word line logical signal) may be applied to the gate of a transistor of cell selection component 230, which may connect the capacitor 220 with the digit line 210 (e.g., providing a conductive path between the capacitor 220 and the digit line 210).

In other examples, the positions of the cell selection component 230 and the capacitor 220 in the memory cell 105-a may be switched, such that cell selection component 230 is coupled with or between the plate line 215 and the cell plate 221, and the capacitor 220 is coupled with or between the digit line 210 and the other terminal of the cell selection component 230. In such an example, the cell selection component 230 may remain in electronic communication with the digit line 210 through the capacitor 220. This configuration may be associated with alternative timing and biasing for access operations.

In examples that employ a ferroelectric capacitor 220, the capacitor 220 may or may not fully discharge upon connection to the digit line 210. In various schemes, to sense the logic state stored by a ferroelectric capacitor 220, a voltage may be applied to the plate line 215 and/or the digit line 210, and the word line 205 may be biased to select the memory cell 105-a. In some cases, the plate line 215 and/or the digit line 210 may be virtually grounded and then isolated from the virtual ground, which may be referred to as a floating condition, prior activating the word line 205.

Operation of the memory cell 105-a by varying the voltage to cell plate 221 (e.g., via the plate line 215) may be referred to as "moving the cell plate." Biasing the plate line 215 and/or the digit line 210 may result in a voltage difference (e.g., the voltage of the digit line 210 minus the voltage of the plate line 215) across the capacitor 220. The voltage difference may accompany a change in the stored charge on capacitor 220, where the magnitude of the change in stored charge may depend on the initial state of the capacitor 220 (e.g., whether the initial logic state stored a logic 1 or a logic 0). In some schemes, the change in the stored charge of the capacitor 220 may cause a change in the voltage of the digit line 210, which may be used by the sense component 130-a to determine the stored logic state of the memory cell 105-a.

The digit line 210 may be coupled with many memory cells 105, and the digit line 210 may have properties that result in a non-negligible intrinsic capacitance 240 (e.g., on the order of picofarads (pF)), which may couple the digit line 210 with a voltage source 250-a. The voltage source 250-a may represent a common ground or virtual ground voltage, or the voltage of an adjacent access line of the circuit 200 (not shown). Although illustrated as a separate component in FIG. 2, the intrinsic capacitance 240 may be associated with properties distributed throughout the digit line 210.

In various examples, the intrinsic capacitance 240 may depend on physical characteristics of the digit line 210, including conductor dimensions (e.g., length, width, thickness) of the digit line 210. The intrinsic capacitance 240 may also depend on characteristics of adjacent access lines or circuit components, proximity to such adjacent access lines or circuit components, or insulation characteristics between the digit line 210 aid such access lines or circuit components. Thus, a change in voltage of digit line 210 after selecting the memory cell 105-a may depend on the net capacitance of (e.g., associated with) the digit line 210. In other words, as charge flows along the digit line 210, some finite charge may be stored in the digit line 210 (e.g., in the intrinsic capacitance 240, in other capacitance coupled with the digit line 210), and the resulting voltage of the digit line 210 may depend on the net capacitance of the digit line 210.

The resulting voltage of the digit line 210 after selecting the memory cell 105-a may be compared to a reference (e.g., a voltage of the reference line 265) by the sense component 130-a to determine the logic state that was stored in the memory cell 105-a. Other operations may be used to support selecting and/or sensing the memory cell 105-a, including operations for supporting differential amplifier schemes for sensing memory cells as described herein.

In some examples, the circuit 200 may include an amplifier component 280, which may be an example of a signal development circuit coupled with or between the memory cell 105-a and the sense component 130-a. The amplifier component 280 may amplify or otherwise convert signals of the digit line 210 before a sensing operation. The amplifier component 280 may include, for example, a transistor, a cascode, or any other charge or voltage amplifier. In some examples, the amplifier component 280 may include a charge transfer sensing amplifier (CTSA). In some examples with an amplifier component 280, a line between the sense component 130-a and the amplifier component 280 may be referred to as a signal line (e.g., signal line 260). In some examples (e.g., examples with or without an amplifier component 280), the digit line 210 may connect directly with the sense component 130-*a*. In some examples, the reference line 265 may also be connected with the amplifier component 280, such as when the amplifier component 280 provides both a signal and a reference for the sense component 130-*a* to determine a logic state stored by the memory cell 105-*a*.

In some examples, the circuit 200 may include a bypass line 270 that may permit selectively bypassing the amplifier component 280 or some other signal generation circuit between the memory cell 105-*a* and the sense component 130-*a*. In some examples, the by pass line 270 may be selectively enabled by way of a switching component 275. In other words, when the switching component 275 is activated, the digit line 210 may be coupled with the signal line 260 via the by pass line (e.g., coupling the memory cell 105-*a* with the sense component 130-*a*). Although illustrated is being connected to the signal line 260, a bypass line 270 may be connected with the sense component 130-*a* at a different portion such that the bypass line 270 is not directly connected with a signal line 260.

In some examples, when the switching component 275 is activated, the amplifier component 280 may be isolated from one or both of the digit line 210 or the signal line 260 (e.g., by another switching component, not shown). When the switching component 275 is deactivated, the digit line 210 may be coupled with the signal line via the amplifier component 280. In other examples, a selection component may be used to couple the memory cell 105-*a* with one of the amplifier component 280 or the bypass line 270. Additionally or alternatively, in some examples, a selection component may be used to couple the sense component 130-*a* with one of the amplifier component 280 or the bypass line 270. In some examples, a selectable bypass line 270 may support generating a sense signal for detecting a logic state of the memory cell 105-*a* by using the amplifier component 280, and generating a write signal to write a logic state to the memory cell 105-*a* that by passes the amplifier component 280.

Some examples of a memory device that supports self-referencing read operations may share a common access line (not shown) between a memory cell 105 and a sense component 130 to support generating a sense signal and a reference signal from the same memory cell 105. In one example, a common access line between an amplifier component 280 and a sense component 130 may be referred to as an "AMPCAP line" or an "AMPCAP node," and the common access line may take the place of the signal line 260 and the reference line 265 illustrated in circuit 200. In such examples the common access line may be connected to a sense component 130 at two different nodes (e.g., a first node 131-*a* and a second node 132-*a* as described herein). In some examples, a common access line may permit a self-referencing read operation to share, in both a signal generating operation and a reference generating operation, component variations that may exist between the sense component 130-*a* and a memory cell 105 being accessed. Such an approach may reduce the sensitivity of the sense component 130-*a* to operational variations of various components in a memory device, such as memory cells 105, access lines (e.g., a word line 205, a digit line 210, a plate line 215), amplifiers (e.g., amplifier component 280), transistors, voltage sources 250, and others.

Although the digit line 210 and the signal line 260 are identified as separate lines, the digit line 210, the signal line 260, and any other lines or nodes between a memory cell 105 and a sense component 130 may be referral to as a single access line in accordance with examples as disclosed herein. Constituent portions of such an access line may be identified separately for the purposes of illustrating intervening components and intervening signals in various example configurations.

The sense component 130-*a* may include various transistors or amplifiers to detect and amplify a difference in signals, which may be referred to as latching. For example, the sense component 130-*a* may include a sense amplifier that receives and compares a sense signal voltage at the first node 131-*a* with a reference signal voltage at the second node 132-*a*. An output of the sense amplifier may be driven to a higher (e.g., a positive) or a lower voltage (e.g., a negative voltage, a ground voltage) based on the comparison at the sense amplifier.

For example, if the first node 131-*a* has a lower voltage than the second node 132-*a*, the output of the sense component 130-*a* may be driven by the sense amplifier to a relatively lower voltage of a first sense component voltage source 250-*b* (e.g., a voltage of $V_1$, which may be a ground voltage substantially equal to $V_0$ or a negative voltage). The sense component 130-*a* may latch the output of the sense amplifier to determine the logic suite stored in the memory cell 105-*a* (e.g., detecting a logic 0 when the first node 131-*a* has a lower voltage than the second node 132-*a*).

If the first node 131-*a* has a higher voltage than the second node 132-*a*, the output of the sense component 130-*a* may be driven to the voltage of a second sense component voltage source 250-*c* (e.g., a voltage of $V_H$). The sense component 130-*a* may latch the output of the sense amplifier to determine the logic state stored in the memory cell 105-*a* (e.g., detecting a logic 1 when the first node 131-*a* has a higher voltage than the second node 132-*a*). The latched output of the sense component 130-*a*, corresponding to the detected logic suite of memory cell 105-*a*, may then be output via one or more input/output (I/O) lines (e.g., I/O line 290), which may include an output through a column decoder 135, an input output component 140, or a memory controller 150 described with reference to FIG. 1.

To perform a write operation on the memory cell 105-*a*, a voltage may be applied across the capacitor 220. Various methods may be used. In one example, rise cell selection component 230 may be activated through the word line 205 to electrically connect the capacitor 220 to the digit line 210. A voltage may be applied across capacitor 220 by controlling the voltage of cell plate 221 (e.g., through plate line 215) and cell bottom 222 (e.g., through digit line 210).

For example, to write a logic 0, cell plate 221 may be taken high (e.g., applying a positive voltage to plate line 215), and cell bottom 222 may be taken low (e.g., grounding digit line 210, virtually grounding digit line 210, applying a negative voltage to digit line 210). The opposite process may be performed to write a logic 1, where cell plate 221 is taken low and cell bottom 222 is taken high. In some cases, the voltage applied across the capacitor 220 during a write operation may have a magnitude equal to or greater than a saturation voltage of a ferroelectric material in the capacitor 220, such that the capacitor 220 is polarized, and thus maintains a charge even when the magnitude of applied voltage is reduced, or if a zero net voltage is applied across the capacitor 220. In some examples, the sense component 130-*a* may be used to perform the write operations, which may include coupling the first sense component voltage source 250-*b* or the second sense component voltage source 250-*c* with the digit line. When the sense component 130-*a* is used to perform the write operations, the amplifier component 280 may or may not be bypassed (e.g., by applying a write signal via the by pass line 270).

The circuit 200, including the sense component 130-a, the cell selection component 230, or the amplifier component 280, may include various types of transistors. For example, the circuit 200 may include n-type transistors, where applying a relative positive voltage to the gate of the n-type transistor that is above a threshold voltage for the n-type transistor (e.g., an applied voltage having a positive magnitude, relative to a source terminal, that is greater than a threshold voltage) enables a conductive path between the other terminals of the n-type transistor (e.g., the source terminal and a drain terminal).

In some examples, the n-type transistor may act as a switching component, where the applied voltage is a logical signal that is used to enable conductivity through the transistor by applying a relatively high logical signal voltage (e.g., a voltage corresponding to a logic 1 state, which may be associated with a positive logical signal voltage supply), or to disable conductivity through the transistor by applying a relatively low logical signal voltage (e.g., a voltage corresponding to a logic 0 state, which may be associated with a ground or virtual ground voltage). In various examples where a n-type transistor is employed as a switching component, the voltage of a logical signal applied to the gate terminal may be selected to operate the transistor at a particular working point (e.g., in a saturation region or in an active region).

In some examples, the behavior of a n-type transistor may be more complex than a logical switching and selective conductivity across the transistor may also be a function of varying source and dram voltages. For example, the applied voltage at the gate terminal may have a particular voltage level (e.g., a clamping voltage) that is used to enable conductivity between the source terminal and the drain terminal when the source terminal voltage is below a certain level (e.g., below the gate terminal voltage minus the threshold voltage). When the voltage of the source terminal voltage or drain terminal voltage rises above the certain level, the n-type transistor may be deactivated such that the conductive path between the source terminal and drain terminal is opened.

Additionally or alternatively, the circuit 200 may include p-type transistors, where applying a relative negative voltage to the gate of the p-type transistor that is above a threshold voltage for the p-type transistor (e.g. an applied voltage having a negative magnitude, relative to a source terminal, that is greater than a threshold voltage) enables a conductive path between the other terminals of the p-type transistor (e.g. the source terminal and a drain terminal).

In some examples, the p-type transistor may act as a switching component, where the applied voltage is a logical signal that is used to enable conductivity by applying a relatively low logical signal voltage (e.g., a voltage corresponding to a logical "1" state, which may be associated with a negative logical signal voltage supply), or to disable conductivity by applying a relatively high logical signal voltage (e.g., a voltage corresponding to a logical "0" state, which may be associated with a ground or virtual ground voltage). In various examples where an p-type transistor is employed as a switching component, the voltage of a logical signal applied to the gate terminal may be selected to operate the transistor at a particular working point (e.g., in a saturation region or in an active region).

In some examples, the behavior of a p-type transistor may be more complex than a logical switching by the gate voltage, and selective conductivity across the transistor may also be a function of varying source and drain voltages. For example, the applied voltage at the gate terminal may have a particular voltage level that is used to enable conductivity between the source terminal and the drain terminal so long as the source terminal voltage is above a certain level (e.g., above the gate terminal voltage plus the threshold voltage). When the voltage of the source terminal voltage falls below the certain level, the p-type transistor may be deactivated such that the conductive path between the source terminal and drain terminal is opened.

A transistor of the circuit 200 may be a field-effect transistor (FET), including a metal oxide semiconductor FET, which may be referred to as a MOSFET. These, and other types of transistors may be formed by doped regions of material on a substrate. In various examples the transistor(s) may be formed on a substrate that is dedicated to a particular component of the circuit 200 (e.g., a substrate for the sense component 130-a, a substrate for the amplifier component 280, a substrate for the memory cell 105-a), or the transistor(s) may be formed on a substrate that is common for particular components of the circuit 200 (e.g., a substrate that is common for the sense component 130-a, the amplifier component 280, and the memory cell 105-a). Some FETs may have a metal portion including aluminum or other metal, but some FETs may implement other non-metal materials such as polycrystalline silicon, including those FETs that may be referred to as a MOSFET. Further, although an oxide portion may be used as a dielectric portion of a FET, other non-oxide materials may be used in a dielectric material in a FET, including those FETs that may be referred to as a MOSFET.

In various examples in accordance with the present disclosure, the amplifier component 280 may include a differential amplifier having two input nodes (e.g., two input terminals) and an output node (e.g., an output terminal). A first of the input nodes may be configured to be coupled with the memory cell 105-a (e.g., via the digit line 210) and the output node may be configured to be coupled with the first node 131-a of the sense component 130-a (e.g., via the signal line 260). In some examples, the differential amplifier may be configured such that a current at the output node is proportional to a difference in voltage between the two input nodes of the differential amplifier. In various examples, the amplifier component 280 may be coupled with or between the memory cell 105-a and the sense component 130-a, or the amplifier component 280 may be a portion of the sense component 130-a, which may or may not be electrically equivalent.

The amplifier component 280 may also include a capacitor or other capacitive element having two nodes (e.g., nodes associated with opposite plates of the capacitor, nodes otherwise on opposite sides of a capacitance), where a first node of the capacitor is coupled with a first input node of the differential amplifier and a second node of the capacitor is coupled with an output node of the differential amplifier. In other words, the amplifier component 280 may include a capacitive feedback line between the output node of the differential amplifier and the first input node of the differential amplifier (e.g., between the signal line 260 and the digit line 210). The gain of the amplifier component may be related to the capacitance of the integrator capacitor, and in some cases, an integrator capacitor having a capacitance that is non-linear with respect to voltage may be implemented to provide a non-linear gain of the amplifier component.

In some examples, the amplifier component 280 may also include a switching component configured to selectively couple the output node with the first input node. In other words, the amplifier component 280 may include a direct feedback line between the output node of the differential amplifier and the first input node of the differential amplifier (e.g., between the signal line 260 and the digit line 210), and the direct feedback line may be selectively enabled or disabled by way of the switching component. In some cases, such a switching component may be operable to bias the output node of the differential amplifier to voltage related to (e.g., the same as) the first input node of the differential amplifier (e.g., to equalize the output node and the first input node).

In some examples, the amplifier component 280 may also include a capacitor (e.g., a reference capacitor) that is coupled with the first input node of the differential amplifier. For example, a first node of such capacitor may be coupled or connected with the first input node of the differential amplifier, and a second node of such a capacitor may be configured to be coupled with a variable voltage source for precharging the capacitor. The second node of the capacitor may be selectively coupled with a first voltage (e.g., with a ground voltage source) or a second voltage (e.g., with a positive or precharging voltage source). In some cases, the reference capacitor may be precharged in a manner where a charge stored in the reference capacitor as a result of the precharging is related to a charge that may be stored by accessed memory cells, and accordingly the reference capacitor may be operable for providing a reference charge for detecting a logic state (e.g., charge state) stored by the memory cell 105-a.

Based at last in part on including the amplifier component 280, a memory device may support particular techniques for sensing a logic state stored by the memory cell 105-a. For example, a method of sensing a logic state may include precharging the reference capacitor, and coupling a memory cell 105-a with the reference capacitor (e.g., via the digit line 210) after precharging the reference capacitor. The method may also include generating a sense signal at the output node of the differential amplifier that is based at least in part on coupling the memory cell 105-a with the reference capacitor, and the capacitive feedback between the output node and an input node that is coupled with the reference capacitor and the memory cell 105-a. A logic state stored by the memory cell 105-a may subsequently be determined at the sense component 130-a based at least in part on the generated sense signal.

Accordingly, the amplifier component 280 may support a development of sense signals that enable improved performance of an associated memory device. For example, the described implementations of an amplifier component 280 may enable the use of voltage supplies having a lower voltage magnitude, may reduce power consumption, may reduce leakage currents, or may reduce or eliminate charge sharing between a memory cell and a sense component. Moreover, the described amplifier schemes may leverage different capacitors for reference signal generation and for setting an amplifier gain, which may decouple design tradeoffs that may be relevant to other signal development circuitry designs. Thus, the described implementations of an amplifier component 280 may support reading memory cells 105 along a longer digit line 210 (e.g., may be more robust to variations along a digit line 210), may support a smaller memory cell footprint (e.g., supporting fewer components such as fewer transistors or smaller latches), may support faster access operations, or may provide other benefits including those described herein, or any combination thereof.

Figure 3:
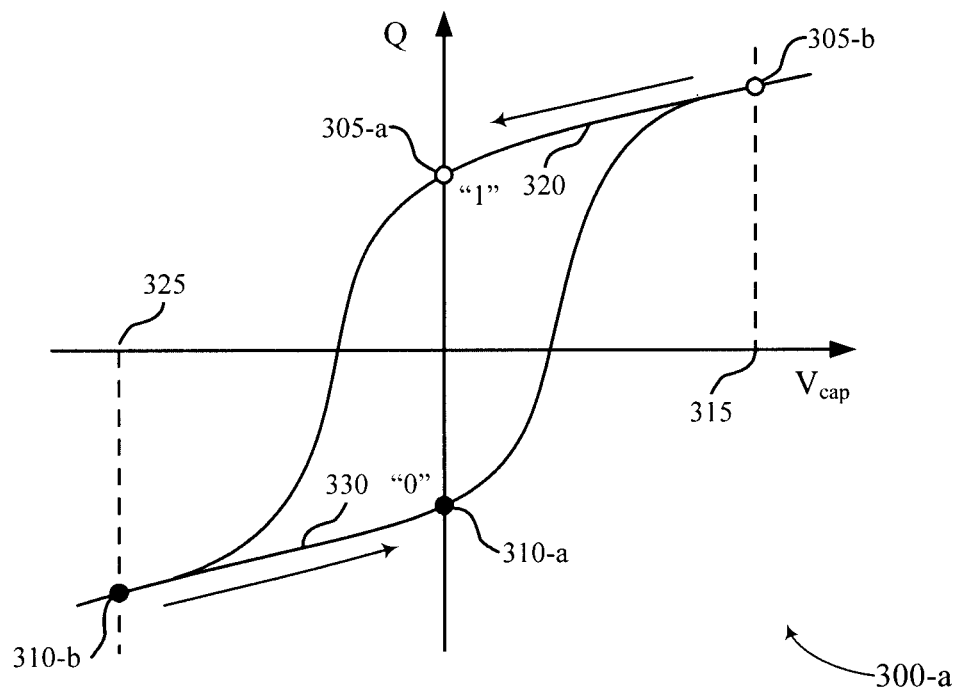
FIG. 3 illustrates an example of non-linear electrical properties with hysteresis plots for a memory cell that supports differential amplifier schemes for sensing memory cells in accordance with examples as disclosed herein.
Figure 3:
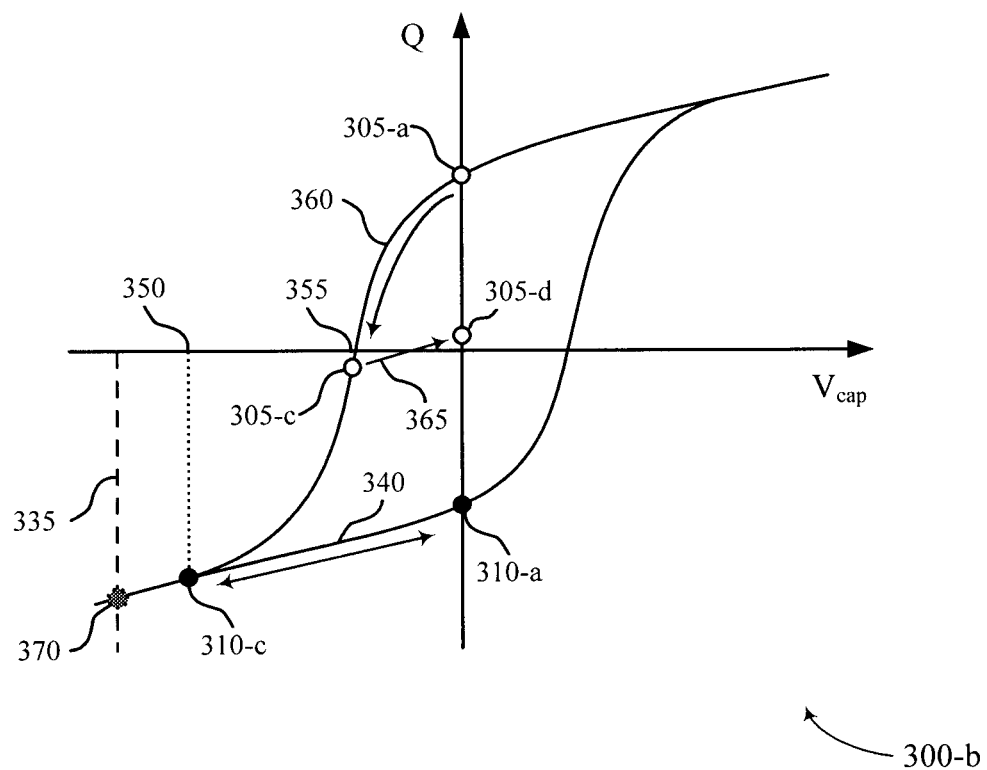

FIG. 3 illustrates an example of non-linear electrical properties with hysteresis plots 300-a and 300-b for a memory cell 105 that supports differential amplifier schemes for sensing memory cells in accordance with examples as disclosed herein. The hysteresis plots 300-a and 300-b may illustrate an example writing process and reading process, respectively, for a memory cell 105 employing a ferroelectric capacitor 220 as described with reference to FIG. 2. The hysteresis plots 300-a and 300-b depict the charge, Q, stored on the ferroelectric capacitor 220 as a function of a voltage difference $V_{cap}$, between the terminals of the ferroelectric capacitor 220 (e.g., when charge is permitted to flow into or out of the ferroelectric capacitor 220 according to the voltage difference $V_{cap}$). For example, the voltage difference $V_{cap}$ may represent the difference in voltage between a digit line side of the capacitor 220 and a plate line side of the capacitor 220 (e.g., $V_{bottom} - V_{plate}$).

A ferroelectric material is characterized by an electric polarization where the material may maintain a non-zero electric charge in the absence of an electric field. Examples of ferroelectric materials include barium titanate ($BaTiO_3$), lead titanate ($PbTiO_3$), lead zirconium titanate (PZT), and strontium bismuth tantalate (SBT). Ferroelectric capacitors 220 described herein may include these or other ferroelectric materials. Electric polarization within a ferroelectric capacitor 220 results in a net charge at the surface of the ferroelectric material, and attracts opposite charge through the terminals of the ferroelectric capacitor 220. Thus, charge may be stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors without ferroelectric properties such as those used in some DRAM arrays. Employing ferroelectric materials may reduce a need to perform refresh operations for some DRAM architectures, such that maintaining logic states of an FeRAM architecture may be associated with lower power consumption than maintaining logic states of a DRAM architecture.

The hysteresis plots 300-a and 300-b may be understood from the perspective of a single terminal of a ferroelectric capacitor 220. By way of example, if the ferroelectric material has a negative polarization, positive charge accumulates at the associated terminal of the ferroelectric capacitor 220. Likewise, if the ferroelectric material has a positive polarization, a negative charge accumulates at the associated terminal of the ferroelectric capacitor 220. Additionally, it should be understood that the voltages in the hysteresis plots 300-a and 300-b represent a voltage difference across the capacitor (e.g., an electric potential between the terminals of the ferroelectric capacitor 220) and are directional. For example, a positive voltage may be realized by applying a positive voltage to the perspective terminal (e.g., a cell bottom 222) and maintaining the reference terminal (e.g., a cell plate 221) at ground or virtual ground (or approximately zero volts (0V)). In some examples, a negative voltage may be applied by maintaining the perspective terminal at ground and applying a positive voltage to the reference terminal (e.g., cell plate 221). In other words, positive voltages may be applied to arrive at a negative voltage difference $V_{cap}$ across the ferroelectric capacitor 220. Similarly, two positive voltages, two negative voltages, or any combination of positive and negative voltages may be applied to the appropriate capacitor terminals to generate the voltage difference $V_{cap}$ shown in the hysteresis plots 300-a and 300-b.

As depicted in the hysteresis plot 300-a, a ferroelectric material used in a ferroelectric capacitor 220 may maintain a positive or negative polarization when them is no net voltage difference between the terminals of the ferroelectric capacitor 220. For example, the hysteresis plot 300-*a* illustrates two possible polarization states, a charge state 305-*a* and a charge state 310-*b*, which may represent a positively saturated polarization state and a negatively saturated polarization state, respectively. The charge states 305-*a* and 310-*a* may be at a physical condition illustrating remnant polarization (Pr) values, which may refer to the polarization (or charge) that remains upon removing the external bias (e.g., voltage). According to the example of the hysteresis plot 300-*a*, the charge state 305-*a* may represent a logic 1 when no voltage difference is applied across the ferroelectric capacitor 220, and the charge state 310-*a* may represent a logic 0 when no voltage difference is applied across the ferroelectric capacitor 220. In some examples, the logic values of the respective charge states may be reversed to accommodate other schemes for operating a memory cell 105.

A logic 0 or 1 may be written to the memory cell by controlling the electric polarization of the ferroelectric material, and thus the charge on the capacitor terminals, by applying a net voltage difference across the ferroelectric capacitor 220. For example, the voltage 315 may be a voltage equal to or greater than a positive saturation voltage, and applying the voltage 315 across the ferroelectric capacitor 220 may result in charge accumulation until the charge state 305-*b* is reached (e.g., writing a logic 1). Upon removing the voltage 315 from the ferroelectric capacitor 220 (e.g., applying a zero net voltage across the terminals of the ferroelectric capacitor 220), the charge state of the ferroelectric capacitor 220 may follow the path 320 shown between the charge state 305-*b* and the charge state 305-*a* at zero voltage across the capacitor. In other words, charge state 305-*a* may represent a logic 1 state at an equalized voltage across a ferroelectric capacitor 220 that has been positively saturated.

Similarly, voltage 325 may be a voltage equal to or lesser than a negative saturation voltage, and applying the voltage 325 across the ferroelectric capacitor 220 results in charge accumulation until the charge state 310-*b* is reached (e.g., writing a logic 0). Upon removing the voltage 325 from the ferroelectric capacitor 220 (e.g., applying a zero net voltage across the terminals of the ferroelectric capacitor 220), the charge state of the ferroelectric capacitor 220 may follow the path 330 shown between the charge state 310-*b* and the charge state 310-*a* at zero voltage across the capacitor. In other words, charge state 310-*a* may represent a logic 0 state at an equalized voltage across a ferroelectric capacitor 220 that has been negatively saturated. In some examples, the voltage 315 and the voltage 325, representing saturation voltages, may have the same magnitude, but opposite polarity across the ferroelectric capacitor 220.

To read, or sense, the stored state of a ferroelectric capacitor 220, a voltage may also be applied across the ferroelectric capacitor 220. In response to the applied voltage, the subsequent charge Q stored by the ferroelectric capacitor changes, and the degree of the change may depend on the initial polarization state, the applied voltages, intrinsic or other capacitance on access lines, and other factors. In other words, the charge state or access line voltage resulting from a read operation may depend on whether the charge state 305-*a* or the charge state 310-*a*, or some other charge state was initially stored, among other factors.

The hysteresis plot 300-*b* illustrates an example of access operations for reading of stored charge states 305-*a* and 310-*a*. A read voltage 335 may be applied, for example, as a voltage difference via a digit line 210 and a plate line 215 as described with reference to FIG. 2. The hysteresis plot 300-*b* may illustrate read operations where the read voltage 335 is a negative voltage difference $V_{cap}$ (e.g., where $V_{bottom} - V_{plate}$ is negative). A negative read voltage across the capacitor may be referred to as a "plate high" read operation, where a plate line 215 is taken initially to a high voltage, and a digit line 210 is initially at a low voltage (e.g., a ground voltage). Although the read voltage 335 is shown as a negative voltage across the ferroelectric capacitor 220, in alternative operations a read voltage may be a positive voltage across the ferroelectric capacitor 220, which may be referred to as a "plate low" read operation.

The read voltage 335 may be applied across the ferroelectric capacitor 220 while a memory cell 105 is selected (e.g., by activating a cell selection component 230 via a word line 205 as described with reference to FIG. 2). Upon applying the read voltage 335 to the ferroelectric capacitor 220, charge may flow into or out of the ferroelectric capacitor 220 via the associated digit line 210 and plate line 215, and, in some examples, different charge states or access line voltages may result depending on whether the ferroelectric capacitor 220 was at the charge state 305-*a* (e.g., a logic 1) or at the charge state 310-*a* (e.g., a logic 0), or some other charge state.

When performing a read operation on a ferroelectric capacitor 220 at the charge state 310-*a* (e.g., a logic 0), additional negative charge may accumulate across the ferroelectric capacitor 220, and the charge state may follow path 340 until reaching the charge and voltage of the charge state 310-*c*. The amount of charge flowing through the capacitor 220 may be related to the intrinsic or other capacitance of the digit line 210 (e.g., intrinsic capacitance 240 described with reference to FIG. 2). In a "plate high" read configuration, a read operation associated with the charge states 310-*a* and 310-*c*, or more generally a read operation associated with the logic 0 state, may be associated with a relatively small amount of charge transfer (e.g., compared to a read operation associated with the charge states 305-*a* and 305-*c*, or more generally the logic 1 state).

As shown by the transition between the charge state 310-*a* and the charge state 310-*c*, the resulting voltage 350 across the ferroelectric capacitor 220 may be a relatively large negative value due to the relatively large change in voltage for the given change in charge. Thus, upon reading a logic 0 in a "plate high" read operation, the digit line voltage, equal to the sum of $V_{PL}$ and the value of ($V_{bottom} - V_{plate}$) at the charge state 310-*c*, may be a relatively low voltage. Such a read operation may not change the remnant polarization of the ferroelectric capacitor 220 that stored the charge state 310-*a*, and thus after performing the read operation the ferroelectric capacitor 220 may return to the charge state 310-*a* via path 340 when the read voltage 335 is removed (e.g., by applying a zero net voltage across the ferroelectric capacitor 220, by equalizing the voltage across the ferroelectric capacitor 220). Thus, performing a read operation with a negative read voltage on a ferroelectric capacitor 220 with a charge state 310-*a* may be considered a non-destructive read process.

When performing the read operation on the ferroelectric capacitor 220 at the charge state 305-*a* (e.g., a logic 1), the stored charge may reverse polarity as a net negative charge accumulates across the ferroelectric capacitor 220, and the charge state may follow the path 360 until reaching the charge and voltage of the charge state 305-*c*. The amount of charge flowing through the capacitor 220 may again be related to the intrinsic or other capacitance of the digit line 210 (e.g., intrinsic capacitance 240 described with reference to FIG. 2). In a "plate high" read configuration, a read operation associated with the charge states 305-*a* and 305-*c*, or more generally a read operation associated with the logic 1 state, may be associated with a relatively large amount of charge transfer (e.g., compared to a read operation associated with the charge states 310-*a* and 310-*c*, or more generally the logic 0 state).

As shown by the transition between the charge state 305-*a* and the charge state 305-*c*, the resulting voltage 355 may, in some cases, be a relatively small negative value due to the relatively small change in voltage at the capacitor 220 for the given change in charge. Thus, upon reading a logic 1 in a "plate high" lead operation, the digit line voltage, equal to the sum of $V_{PL}$ and $V_{cap}$ (e.g., $V_{bottom}-V_{plate}$) at the charge state 310-*c*, may be a relatively high voltage.

The transition from the charge state 305-*a* to the charge state 305-*d* may be illustrative of a sensing operation that is associated with a partial reduction or partial reversal in polarization or charge of a ferroelectric capacitor 220 of a memory cell 105 (e.g., a reduction in the magnitude of charge Q from the charge state 305-*a* to the charge state 305-*d*). In other words according to the properties of the ferroelectric material, after performing the read operation the ferroelectric capacitor 220 may not return to the charge state 305-*a* when the read voltage 335 is removed (e.g., by applying a zero net voltage across the ferroelectric capacitor 220, by equalizing the voltage across the ferroelectric capacitor 220). Rather, when applying a zero net voltage across the ferroelectric capacitor 220 after a read operation of the charge state 305-*a* with read voltage 335, the charge state may follow path 365 from the charge shite 305-*c* to the charge state 305-*d*, illustrating a net reduction in polarization magnitude (e.g., a less positively polarized charge state than initial charge state 305-*a*, illustrated by the difference in charge between the charge state 305-*a* and the charge state 305-*d*). Thus, performing a read operation with a positive read voltage on a ferroelectric capacitor 220 with a charge state 305-*a* may be described as a destructive read process. However, in some sensing schemes, a reduced remnant polarization may still be read as the same stored logic state as a saturated remnant polarization state (e.g., supporting detection of a logic 1 from both the charge state 305-*a* and the charge state 305-*d*), thereby providing a degree of non-volatility for a memory cell 105 with respect to read operations.

The position of the charge state 305-*c* and the charge state 310-*c* after initiating a read operation may depend on a number of factors, including the specific sensing scheme and circuitry. In some cases, the final charge may depend on the net capacitance of the digit line 210 coupled with the memory cell 105, which may include an intrinsic capacitance 240, integrator capacitors, reference capacitors, and others. For example, if a ferroelectric capacitor 220 is electrically coupled with digit line 210 at 0V and the read voltage 335 is applied to the plate line, the voltage of the digit line 210 may rise when the memory cell 105 is selected due to charge flowing from the ferroelectric capacitor 220 to the net capacitance of the digit line 210. Thus, a voltage measured at a sense component 130 may not be equal to the read voltage 335, or the resulting voltages 350 or 355, and instead may depend on the voltage of the digit line 210 following a period of charge sharing.

The position of the charge state 305-*c* and the charge state 310-*c* on hysteresis plot 300-*b* upon initiating a read operation may depend on the net capacitance of the digit line 210 and may be determined through a load-line analysis. In other words, the charge states 305-*c* and 310-*c* may be defined with respect to the net capacitance of the digit line 210, or other access line (e.g., a signal line 260). As a result, the voltage of the ferroelectric capacitor 220 after initiating a read operation (e.g., voltage 350 when reading the ferroelectric capacitor 220 that stored the charge state 310-*a*, voltage 355 when reading the ferroelectric capacitor 220 that stored the charge state 305-*a*), may be different and may depend on the initial state of the ferroelectric capacitor 220. In some examples, the amount of change in polarization of a ferroelectric capacitor 220 of a memory cell 105, for instance as a result of a sensing operation, may be selected according to a particular sensing scheme. In some examples, sensing operations having a greater change in polarization of a ferroelectric capacitor 220 of a memory cell 105 may be associated with relatively greater robustness in detecting a logic state of a memory cell 105 (e.g., wider sense margins).

The initial state of the ferroelectric capacitor 220 may be determined by comparing the voltage of a digit line 210 (or signal line 260, where applicable) resulting from the read operation with a reference voltage (e.g., via a reference line 265 as described with reference to FIG. 2, or via a common access line). In some examples, the digit line voltage may be the sum of the plate line voltage and the final voltage across the ferroelectric capacitor 220 (e.g., voltage 350 when reading the ferroelectric capacitor 220 having a stored the charge state 310-*a*, or voltage 355 when rearing the ferroelectric capacitor 220 having a stored the charge state 305-*a*). In some examples, the digit line voltage may be the difference between the read voltage 335 and the final voltage across the capacitor 220 (e.g., tread voltage 335 voltage 350) when reading the ferroelectric capacitor 220 having a stored the charge state 310-*a*, (read voltage 335-voltage 355) when reading the ferroelectric capacitor 220 having a stored the charge suite 305-*a*).

In some examples, read operations of a memory cell 105 may be associated with a fixed voltage of a digit line 210, where a charge state of a ferroelectric capacitor 220 after initialing a read operation may be the same regardless of its initial charge state. For example, in a read operation where a digit line 210 is held at a fixed read voltage 335, the ferroelectric capacitor 220 may move to a charge state 370 for both the case where the ferroelectric capacitor initially stored a charge state 305-*a* and the case where the ferroelectric capacitor initially stored a charge state 310-*a*. Rather than using a difference in voltage of a digit line 210 to detect an initial charge state or logic state, in some examples, the initial charge state or logic state of the ferroelectric capacitor 220 may be determined based at least in part on the difference in charge associated with the read operation. For example, as illustrated by hysteresis plot 300-*b*, a logic 1 may be detected based on difference in charge, Q, between charge state 305-*a* and charge state 370 (e.g., a relatively large amount of charge transfer), and a logic 0 may be detected based on a difference in charge, Q, between charge state 310-*a* and charge state 370 (e.g., a relatively small amount of charge transfer).

In some examples, such a detection may be supported by a charge-transfer sensing amplifier, a cascode (e.g., a transistor configured in a cascode arrangement), a transconductance or other differential amplifier, or other signal development circuitry between a digit line 210 and a signal line 260, where a voltage of the signal line 260 may be based at least in part on the amount of charge transfer of a capacitor 220 after initiating a read operation (e.g., where the described charge transfer may correspond to an amount of charge that passes through the charge-transfer sensing amplifier, cascode, or other signal development circuitry). In such examples, the voltage of the signal line 260 may be compared with a reference voltage (e.g., at a sense component 130) to determine the logic state initially stored by the ferroelectric capacitor 220, despise the digit line 210 being held at a fixed voltage level. In some examples, a digit line 210 may be used to provide a reference voltage (e.g., in a configuration where a reference line 265 is configured to be coupled with the digit line 210).

In examples where a digit line 210 is held at a fixed read voltage 335, a capacitor 220 may be negatively saturated after a read operation irrespective of whether the capacitor 220 was initially at a charge state 305-a (e.g., a logic 1) or initially at a charge state 310-a (e.g., a logic 0). Accordingly, after such a read operation, the capacitor 220 may, at least temporarily, be charged according to a logic 0 state irrespective of its initial or intended logic state. Thus, a rewrite operation may be required at feast when the capacitor 220 is intended to store a logic 1 state, where such a rewrite operation may include applying a write voltage 315 to store a logic 1 state as described with reference to hysteresis plot 300-a. Such rewrite operations may be configured or otherwise described as a selective rewrite operation, since a rewrite voltage may not need to be applied when the capacitor 220 is intended to store a logic 0 state. In some examples, such an access scheme may be referred to as a "2Pr" scheme, where the difference in charge transfer for distinguishing a logic 0 from a logic 1 may be equal to two times the remnant polarization of a memory cell 105 (e.g., a difference in charge between charge state 305-a, a positively saturated charge state, and charge state 310-a, a negatively saturated charge state).

In some sensing schemes, a reference voltage may be generated such that the reference voltage is between the possible voltages (e.g., of a digit line 210, of a signal line 260) that may result from reading different logic states. For example, a reference voltage may be selected to be lower than the resulting digit line voltage when reading a logic 1, and higher than the resulting digit line voltage when reading a logic 0. In other examples a comparison may be made at a portion of a sense component 130 that is different from a portion where a digit line is coupled, and therefore a reference voltage may be selected to be lower than the resulting voltage at the comparison portion of the sense component 130 when reading a logic 1, and higher than the resulting voltage at the comparison portion of the sense component 130 when reading a logic 0. During comparison by the sense component 130, the voltage based on the sensing may be determined to be higher or lower than the reference voltage, and the stored logic state of the memory cell 105 (e.g., a logic 0, a logic 1) may thus be determined.

During a sensing operation, the resulting signals from reading various memory cells 105 may be a function of manufacturing or operational variations between the various memory cells 105. For example, capacitors of various memory cells 105 may have different levels of capacitance or saturation polarization, so that a logic 1 may be associated with different levels of charge from one memory cell to the next, and a logic 0 may be associated with different levels of charge from one memory cell to the next. Further, intrinsic capacitance (e.g., intrinsic capacitance 240 described with reference to FIG. 2) may vary from one digit line 210 to the next digit line 210 in a memory device, and may also vary within a digit line 210 from the perspective of one memory cell 105 to the next memory cell 105 on the same digit line. Thus, for these and other reasons, reading a logic 1 may be associated with different levels of voltage of a digit line 230 or a signal line 260 from one memory cell to the next (e.g., resulting voltage 350 may vary from reading one memory cell 105 to the next), and reading a logic 0 may be associated with different levels of voltage of a digit line 210 or a signal line 260 from one memory cell to the next (e.g., resulting voltage 355 may vary from reading one memory cell 105 to the next).

In some examples, a reference voltage may be provided between a statistical average of voltages associated with reading a logic 1 and a statistical average of voltages associated with reading a logic 0, but the reference voltage may be relatively closer to the resulting voltage of reading one of the logic states for any given memory cell 105. The minimum difference between a resulting voltage of reading a particular logic state (e.g., as a statistical value for reading a plurality of memory cells 105 of a memory device) and an associated level of a reference voltage may be referred to as a "minimum read voltage difference" or a "read margin," and having a low minimum read voltage difference or read margin may be associated with difficulties or sensitivities in reliably sensing the logic states of memory cells 105 in a given memory device 100.

Figure 4:
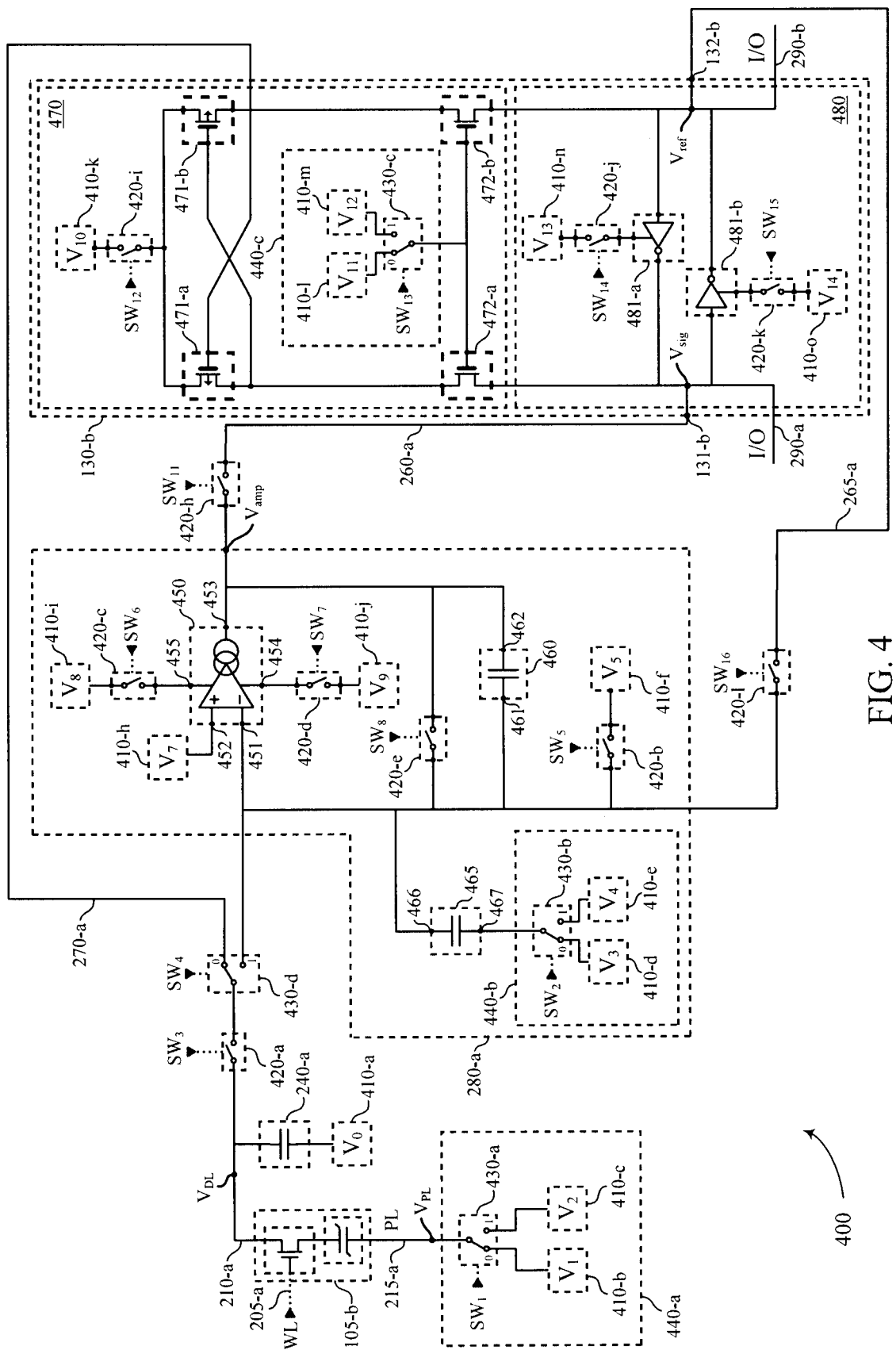
FIG. 4 illustrates an example of a circuit that supports differential amplifier schemes for sensing memory cells in accordance with examples as disclosed herein.

FIG. 4 illustrates an example of a circuit 400 that supports differential amplifier schemes for sensing memory cells in accordance with examples as disclosed herein. The circuit 400 may include a memory cell 105-b aid a sense component 130-b for sensing a logic state of the memory cell 105-b. The memory cell 105-b and the sense component 130-b may be examples of the respective components described with reference to FIGS. 1 and 2.

The circuit 400 may include a word line 205-a, a digit line 210-a, and a plate line 215-a. Each of the word line 205-a, the digit line 210-a and the plate line 215-a may be coupled with one or more memory cells 105, including the memory cell 105-b as shown. The digit line 210-a and the plate line 215-a may be associated with voltages $V_{DL}$ and $V_{PL}$, respectively, as shown. In some examples, the digit line 210-a may be associated with an intrinsic capacitance, which may illustrated by intrinsic capacitance 240-a. The circuit 400 may include a signal line 260-a coupled with the sense component 130-b at a first node 131-b, and a reference line 265-a coupled with the sense component 130-b at a second node 132-b. The circuit 400 may include a first I/O line 290-a and a second I/O line 290-b. In some examples, the circuit 400 may also include a bypass line 270-a (e.g., as illustrated between the sense component 130-b aid the memory cell 105-b), which may permit certain signals between the sense component 130-b and the memory cell 105-b (e.g., write signals) to bypass the amplifier component 280-a. Each of these illustrated components may be examples of the respective components described with reference to FIG. 2.

The circuit 400 may include the word line 205-a for selecting or deselecting the memory cell 105-b (e.g., by way of logic signal WL). The circuit 400 may include the plate line 215-a for accessing a cell plate of a capacitor of the memory cell 105-b. Thus, the memory cell 1055-b may represent a memory cell coupled with or between a first access line (e.g., the digit line 210-a, the signal line 260-a) and a second access line (e.g., the word line 205-a). Electrical signals may be communicated between the sense component 130-b and an input/output component 140 (not shown) via input/output lines 200-b and 200-c, where signals of the input/output lines 290-b and 290-c may be illustrated by the voltages $V_{sig}$ and $V_{ref}$, respectively. In other words, as illustrated, the sense component 130-b may be coupled with the memory cell 105-b and coupled with at input/output component 140.

The circuit 400 may include an amplifier component 280-*a*, which may be an example of the amplifier component 280 described with reference to FIG. 2. In the example of circuit 400, the amplifier component 280-*a* may include a differential amplifier 450, which may have a first input node 451, a second input node 452, and an output node 453. An output voltage of the amplifier component 280-*a* (e.g., an output voltage of the differential amplifier 450) may be illustrated by a voltage $V_{amp}$ at an output node of the amplifier component 280-*a*. In some examples, the amplifier component 280-*a* may be in electronic communication with a memory controller (not shown), such as a memory controller 150 described with reference to FIG. 1, which may control various operations of the amplifier component 280-*a*.

In some examples, the differential amplifier 450 may be configured such that a current at the output node is proportional to a difference in voltage between the two input nodes of the differential amplifier. In some cases, the configuration of the differential amplifier 450 may be referred to as a "transconductance" amplifier. For example, the first input node 451 may be considered a "negative" node and the second input node 452 may be considered a "positive" node. In some examples, the differential amplifier 450 may be configured such that the current at the output node 453 is proportional to the voltage at the second input node 452 minus the voltage at the first input node 451. However, the described techniques may leverage different amplifier configurations or architectures.

In the example of circuit 400, the amplifier component 280-*a* may include an integrator capacitor 460 (e.g., a first capacitor, a first capacitance, a first capacitive element), which may have a first node 461 and a second node 462. In the example of circuit 400, the first node 461 may be coupled or connected with the first input node 451, and the second node 462 may be coupled or connected with the output node 453. In other words, the amplifier component 280-*a* illustrates an example of including a differential amplifier 450 with a capacitive feedback line (e.g., via the capacitance of the integrator capacitor 460).

In some examples, a gain or total amplification factor of the amplifier component 280-*a* may be related to (e.g., inversely proportional to) the capacitance of the integrator capacitor 460. In some cases, the integrator capacitor 460 may be configured with a capacitance that is non-linear with respect to voltage, which may be used to support a gain of the amplifier component 280-*a* that is non-linear with respect to voltage. Such a configuration may enable the amplifier component 280-*a* to provide a relatively higher gain for memory cells 105 that are weakly charged or have relatively low capacitance or charge capacity (e.g., to improve read margins, to support a larger sensing signal to overcome latch mismatches), and provide a relatively lower gain for memory cells 105 that are strongly charged or have relatively high capacitance or charge capacity (e.g., to reduce signal saturation effects associated with highly charged memory cells 105, to avoid large supply current changes).

In the example of circuit 400, the amplifier component 280-*a* may also include a reference capacitor 465 (e.g., a second capacitor, a second capacitance, a second capacitive element), which may have a first node 466 and a second node 467. In the example of circuit 400, the first node 466 may also be coupled or connected with the first input node 451 of the differential amplifier, and the second node 467 may be coupled or connected with a variable voltage source 440-*b*.

In some examples, the capacitance of the reference capacitor 465, a voltage of the variable voltage source 440-*b*, or a combination thereof, may be configured to provide a reference charge for sensing operations of the amplifier component 280-*a* for example, according to certain precharging operations, a reference charge of the reference capacitor 465 may be configured for a charge transfer with the digit line 210-*a* that is an average, between a logic 0 and a logic 1, of a charge transfer of the memory cell 105-*b*, or a representative population of memory cells 105, with the digit line 210-*a*. In other words, the reference charge of the reference capacitor 465, according to a capacitance of the reference capacitor 465 and a voltage of the variable voltage source 440-*b*, may be configured for establishing a reference behavior of the digit line 210-*a* for distinguishing whether the memory cell 105-*b* was written with a logic 0 or a logic 1. In some cases, such an approach may enable the amplifier component 280-*a* to decrease or eliminate a sensitivity of a read operation to an intrinsic capacitance of the digit line 210-*a* (e.g., decreasing or eliminating an effect of the intrinsic capacitance 240-*a* on read operations). Further, leveraging a reference charge of the reference capacitor 465 may provide other benefits compared with other reference signaling, such as operations that rely on a separately provided reference voltage. For example, leveraging a reference charge rather than a separately configured reference voltage source may support reducing a quantity of voltage sources and improving read margins, among other benefits.

In the example of circuit 400, the amplifier component 280-*a* may include a switching component 420-*e*, which may be used to selectively connect or disconnect the output node 453 with the first input node 451 (e.g., by activating or deactivating a logical signal $SW_8$). In other words, the amplifier component 280-*a* may include a differential amplifier 450 having a direct feedback line that may be selectively enabled or disabled via the switching component 420-*e*. In some examples, the switching component 420-*e* may be operable for equalizing a voltage between the output node 453 and the first input node 451, which may further include equalizing the output node 453 and the first input node 451 with a same voltage or voltage sources as the second input node 452. Moreover, in some examples, the switching component 420-*e* may be operable for discharging or equalizing the integrator capacitor 460. In other examples of an amplifier component 280, the switching component 420-*e* may be omitted. For example, when the switching component 420-*e* is omitted, the output node 453 of the differential amplifier 450 may be selectively coupled or decoupled with another voltage source that provides an equalization of the output node 453.

In some examples, the differential amplifier 450 may be configured such that, when the voltage at the first input node 451 is higher than the voltage at the second input node 452, current may flow into the output node 453 (e.g., into the differential amplifier low voltage source, such as into voltage source 410-*j*). Accordingly, the differential amplifier 450 may be capable of supporting a negative gain in the amplifier component 280-*a*.

The circuit 400 may include switching components 420 or selection components 430 to selectively couple, decouple, or by pass the amplifier component 280-*a* or the sense component 130-*a* for various access operations. For example, the circuit 400 may include a switching component 420-*a* to support selectively coupling or decoupling the memory cell 105-*b* (e.g., via the digit line 210-*a*) from one or both of the amplifier component 280-*a* or the sense component 130-*a* (e.g., by activating or deactivating a logical signal SW$_3$).

In some examples, the switching component 420-*a* associated with the memory cell 105-*b* may be one of a plurality of switching components 420 associated with respective ones of a plurality of memory cells 105. In such examples, the plurality of switching components 420 (e.g., including the switching component 420-*a*) may be referred to, or otherwise included in, a digit line multiplexer, a digit line selector, or a digit line shunt In such examples, one of the plurality of memory cells 105 (e.g., the memory cell 105-*b*) may be selected, and the other of the plurality of memory cells 105 may be deselected (e.g., remaining in an "idle" state).

The circuit 400 may also include a switching component 420-*h* to support selectively coupling or decoupling the amplifier component 280-*a* with the sense component 130-*a* (e.g., by activating or deactivating a logical signal SW$_{11}$). Further, in the example of circuit 400, a selection component 430-*d* is provided, and may selectively couple the memory cell 105-*b* (e.g., the digit line 210-*a*) with one of the amplifier component 280-*a* or the sense component 130-*b* (e.g., via bypass line 270-*a*). In other words, when the selection component 430-*d* is deactivated (e.g., by deactivating a logical signal SW$_4$), signals may be shared directly between the digit line 210-*a* and the sense component 130-*b*, which may include bypassing the amplifier component 280-*a*. In some examples, this operational state may advantageously support certain write operations. When the selection component 430-*d* is activated (e.g., by activating a logical signal SW$_4$), signals may be shared between the digit line 210-*a* and the sense component 130-*b* by way of the amplifier component 280-*a*. In some examples, this operational state may advantageously support certain read operations. In other words, the selection component 430-*d* may be activated or deactivated based on whether the circuit 400 is supporting a read operation or a write operation.

The circuit 400 may include a variety of voltage sources 410 and variable voltage sources 440, which may be coupled with various voltage supplies and/or common grounding or virtual grounding points of a memory device that may include the example circuit 400. Although variable voltage sources 440 are illustrated as including two respective voltage sources 410 and a respective selection component 430, a variable voltage source 440 supporting the operations herein may include other configurations, such as a voltage buffer or a deviator that provides an otherwise variable voltage.

A voltage source 410-*a* may represent a common grounding point (e.g., a chassis ground, a neutral point), which may be associated with a common reference voltage having a voltage V$_0$, from which other voltages are defined. The voltage source 410-*a* may be coupled with the digit line 210-*a* via the intrinsic capacitance 240-*a* of the digit line 210-*a*.

A variable voltage source 440-*a* may represent a variable plate line voltage source, and may be coupled with the memory cell 105-*b* via the plate line 215-*a* of the memory cell 105-*b*. In various examples, the variable voltage source 440-*a* may be used for access operations (e.g., read operations, write operations), including those operations described with reference to hysteresis plots 300-*a* and 300-*b* of FIG. 3. The variable voltage source 440-*a* may include a voltage source 410-*b* having a voltage V$_1$ (e.g., a voltage source having a voltage that is below a threshold, a voltage that is relatively lower than V$_2$) and a voltage source 410-*c* having a voltage V$_2$ (e.g., a voltage source having a voltage that is above a threshold, a voltage that is relatively higher than V$_1$). One of the voltage source 410-*b* or the voltage source 410-*c* may be selectively coupled with the plate line 215-*a* via a selection component 430-*a*, which may be activated or deactivated by a logical signal SW$_1$. In one example, V$_1$ may be selected to be equal to 0V and V$_2$ may be selected to be equal to 1.5V.

A variable voltage source 440-*b* may represent a variable precharging or reference voltage source, and may be coupled with the second node 467 of the reference capacitor 465. In various examples the variable voltage source 440-*b* may be used for access operations (e.g., read operations), including those operations described with reference to hysteresis plots 300-*a* and 300-*b* of FIG. 3. The variable voltage source 440-*b* may include a voltage source 410-*d* having a voltage V$_3$ (e.g., a voltage source having a voltage that is below a threshold, a voltage that is relatively lower than V$_4$) and a voltage source 410-*e* having a voltage V$_4$ (e.g., a voltage source having a voltage that is above a threshold, a voltage that is relatively higher than V$_3$). One of the voltage source 410-*d* or the voltage source 410-*c* may be selectively coupled with the reference capacitor 465 via a selection component 430-*b*, which may be activated or deactivated by a logical signal SW$_2$. In one example, V$_3$ may be selected to be equal to 0V and V$_1$ may be selected to be equal to 1.85V.

A voltage source 410-*f* may represent an amplifier input equalization voltage source (e.g., a chassis ground, a neutral point), and may be associated with a voltage V$_5$. In various examples, the voltage source 410-*f* may or may not be associated with a same reference point as the common grounding point of voltage source 410-*a*. The voltage source 410-*f* may be selectively coupled with the first input node 451 of the differential amplifier 450 via a switching component 420-*b*, which may be activated or deactivated by a logical signal SW$_5$. In examples where the amplifier component 280-*a* includes the switching component 420-*e*, the voltage source 410-*f* may also support equalizing the output node 453 of the differential amplifier 450 (e.g., when the switching component 420-*e* is activated), or equalizing the integrator capacitor 460, and thus the voltage source 410-*f* may be referred to as an amplifier equalization voltage source.

A voltage source 410-*h* may represent a differential amplifier reference voltage source, and may be associated with a voltage V$_7$. In the example of circuit 400 the voltage source 410-*h* may be coupled directly with the second input node 452 of the differential amplifier 450. In other examples, the voltage source 410-*h* may be selectively coupled or decoupled with the second input node 452 by a switching component 420 (not shown). In one example, the voltage V$_7$ may be approximately 0V, and may be coupled with a same voltage supply as, for example, voltage source 410-*a*, voltage source 410-*b*, voltage source 410-*d*, voltage source 410-*f*, or a combination thereof.

A voltage source 410-*j* may represent a differential amplifier high voltage source, and may be associated with a voltage V$_8$. The voltage source 410-*i* may be selectively coupled with a first supply node of the differential amplifier 450 via a switching component 420-*c*, which may be activated or deactivated by a logical signal SW$_6$. A voltage source 410-*j* may represent a differential amplifier low voltage source, and may be associated with a voltage V$_9$. The voltage source 410-*j* may be selectively coupled with a second supply node of the differential amplifier 450 via a switching component 420-*d*, which may be activated or deactivated by a logical signal SW$_7$. In one example, V$_8$ may be selected to be equal to 1.0V and V$_9$ may be selected to be equal to −0.8V. In other words, in some examples, the differential amplifier 450 may be supplied with a positive voltage and a negative voltage via the voltage sources 410-*i* and 410-*j*.

In some examples, activating $SW_6$, $SW_7$, or both may be referred to as "enabling" or "activating" the differential amplifier 450. In some examples, logical signals $SW_6$ and $SW_7$ may be provided by the same logical signal (e.g., by a memory controller), or logical signals $SW_6$ and $SW_7$ may be shared in a different manner, or logical signals $SW_6$ and $SW_7$ may otherwise be substantially the same logical signal.

The sense component 130-*b* may, in some examples, be used to latch signals associated with a read operation when detecting a logic state stored by a memory cell 105. Electrical signals associated with such latching may be communicated between the sense component 130-*a* (e.g., a sense amplifier) and an input-output component 140 (not shown), for example, via I/O lines 290-*a* and 290-*b*. In some examples, the sense component 130-*b* may be in electronic communication with a memory controller (not shown), such as a memory controller 150 described with reference to FIG. 1, which may control various operations of the sense component 130-*b*.

In some examples, the first node 131-*b* may be referred to as a signal node, and may be electrically equivalent to, or otherwise associated with (e.g., coupled with) the signal line 260-*a*. The first node 131-*b* may be coupled with the amplifier component 280-*a* (e.g., the output node 453 of the differential amplifier 450) via switching component 420-*h*. In other words, the switching component 420-*h* may illustrate a switching component 420 coupled with or between the memory cell 105-*b* and the first node 131-*b*, and configured to selectively couple the memory cell 105-*b* with the first node 131-*b*.

In some examples, the second node 132-*b* may be referred to as a reference node, and may be electrically equivalent to, or otherwise associated with (e.g., coupled with) the reference line 265-*a*. The second node 132-*c* may be selectively coupled or decoupled with the first input node 451 of the differential amplifier 450 via a switching component 420-*l*, which may be activated or deactivated by way of logical signal $SW_{16}$. In other words, the switching component 420-*l* may illustrate a switching component 420 coupled with or between the first input node 451 and the second node 132-*b*, and configured to selectively couple the first input node 451 with the second node 132-*b*.

In some examples, a first node 131 and a second node 132 may be located at different portions of the sense component 130-*b*, which may or may not be electrically equivalent to the positions of the first node 131-*b* and the second node 132-*b* illustrated in the circuit 400. For example, the first node 131-*b* may be located outside a sense amplifier of the sense component 130-*b* (e.g., electrically equivalent with such a location), and the first node 131-*b* may therefore be coupled with or between (e.g., be located between) a sense amplifier and the memory cell 105-*b*. In another example the second node 132-*b* may be located outside a sense amplifier of the sense component 130-*b* (e.g., electrically equivalent with such a location), and the second node 132-*b* may therefore be coupled with or between (e.g., located between) the sense amplifier and the differential amplifier 450.

In some examples, the first node 131-*b* may be electrically equivalent to the input-output line 290-*a*, and the second node 132-*b* may be electrically equivalent to input-output line 290-*b*. In other examples the first node 131-*b* and the second node 132-*b* may refer to other portions of a sense component 130, and may or may not be electrically equivalent to input/output fines 290-*a* or 290-*b*.

In the example of circuit 400, the sense component 130-*b* may include a high voltage portion 470 and a low voltage portion 480. The high voltage portion 470 may include components having a relatively higher voltage isolation characteristic, and the low voltage portion 480 may include components having a relatively lower voltage isolation characteristic. In various examples of the sense component 130-*b*, the described voltage isolation characteristic may refer to one or more properties, or combinations of properties, of the components of the high voltage portion 470 and the low voltage portion 480.

For example, the voltage isolation characteristics may refer to an isolation voltage, an activation threshold voltage (e.g., a threshold voltage of one or more transistors), a degree of insulation between a transistor gate and a transistor body, a degree of insulation between a source and drain of associated transistors, a gate insulation thickness, or other examples of voltage isolation characteristics. Further, the described voltage isolation characteristics may refer to a nominal characteristic or a threshold characteristic (e.g., an upper threshold, a lower threshold), and may also include or otherwise account for variations due to manufacturing tolerances, operational tolerances, or any other sources of variation from the nominal or threshold voltage isolation characteristic.

The high voltage portion 470 may be selectively coupled or decoupled with the memory cell 105-*b* (e.g., by activating or deactivating the selection component 430-*d*) via the by pass line 270-*a* and the digit line 210-*a*. The low voltage portion 480 may be selectively coupled with the amplifier component 280-*a* (e.g., by activating or deactivating the switching component 420-*h*) via the signal line 260-*a*, and the low voltage portion 480 and the amplifier component 280-*a* may also be selectively coupled or decoupled with the memory cell 105-*b* (e.g., by activating or deactivating the selection component 430-*d*) via the digit line 210-*a*. The low voltage portion 480 may be coupled with the output node 453 of the differential amplifier 450 via a switching component 420-*h* that may have the relatively lower voltage isolation characteristic.

The high voltage portion 470 may, in some examples, include a pair of cross-coupled p-type transistors 471-*a* and 471-*b*, each having the relatively higher voltage isolation characteristic. For example, the pair of cross-coupled p-type transistors 471-*a* and 471-*b* may have a relatively high gate insulation thickness. The cross-coupled p-type transistors 471-*a* and 471-*b* may be coupled with a voltage source 410-*k* via a switching component 420-*i* having the relatively higher voltage isolation characteristic. The switching component 420-*i* may be activated or deactivated by a logical signal $SW_{12}$. The voltage source 410-*k* may have a voltage $V_{10}$, which may represent a high sense component source voltage of the sense component 130-*b*. In some examples, the voltage level $V_{10}$ may be selected to support writing operations of the memory cell 105-*b* (e.g., supporting a saturation polarization of the memory cell 105-*b*). In one example, $V_{10}$ may be selected to be equal to 1.5V.

The high voltage portion 470 may also include a pair of n-type transistors 472-*a* and 472-*b*, each having the relatively higher voltage characteristic, and configured in a clamping configuration. For example, the gate terminals of each of the n-type transistors 472-*a* and 472-*b* may be coupled with a variable voltage source 440-*c* (e.g., providing different voltages, supporting a voltage being enabled and disabled or grounded).

In various examples, the variable voltage source 440-c may be used for access operations (e.g., read operations, write operations), including those operations described with reference to hysteresis plots 300-a and 300-b of FIG. 3. For example, the variable voltage source 440-c may represent a sense amplifier clamping voltage source, and may be used to selectively couple or isolate the high voltage portion 470 and the low voltage portion 480. The variable voltage source 440-c may include a voltage source 410-l having a voltage $V_{11}$ (e.g., a voltage source having a voltage that is below a threshold, a voltage that is relatively lower than $V_{12}$) and a voltage source 410-m having a voltage $V_{12}$ (e.g., a voltage source having a voltage dial is above a threshold, a voltage that is relatively higher than $V_{11}$). One of the voltage source 410-1 or the voltage source 410-m may be selectively coupled with the pair of n-type transistors 472-a and 472-b via a selection component 430-c, which may be activated or deactivated by a logical signal $SW_{13}$. In other words, the high voltage portion 470 and the low voltage portion 480 may be selectively coupled or isolated (e.g., selectively permitting passage of signals between them or preventing passage of signals between them) by activating or deactivating logical signal $SW_{13}$.

The voltage $V_{12}$ may be selected such that signals passing from the high voltage portion 470 to the low voltage portion 480 are limited based at least in part on the voltage level $V_{12}$ (e.g., limited to a level of $V_{12}$-$V_{th,clamp}$, where $V_{th,clamp}$ is equal to the activation threshold voltage of the n-type transistor 472-a or 472-b). In some examples, the voltage $V_{12}$ may be selected to be substantially equal to (e.g., coupled with the same voltage supply as) the voltage $V_{10}$. The pair of cross-coupled n-type transistors 472-a and 472-b may have a relatively high gate insulation thickness, which may be substantially (e.g., nominally) the same gate insulation thickness, or at least as thick as a minimum gate insulation thickness as the pair of cross-coupled p-type transistors 471-a and 471-b.

The low voltage portion 480 may be coupled with the input/output line 290-a and the input/output line 290-b, which in some examples may include a selective coupling (e.g., via other switching components 420, not shown, which may have the relatively lower voltage isolation characteristic). The low voltage portion 480 may also include a pair of amplifiers 480-a and 481-b, each having the relatively lower voltage isolation characteristic. In some examples, the illustrated configuration of the low voltage portion 480 may be referred to as a low-voltage latch. In some examples, the pair of amplifiers 481-a and 481-b may refer to, or may be otherwise replaced with a pair of cross-coupled n-type transistors, each basing the relatively lower voltage isolation characteristic.

For example, such a pair of cross-coupled n-type transistors may have a relatively low gate insulation thickness, as compared with the transistors 471 or 472 of the high voltage portion 470. In some examples, the use of amplifiers 481 having the lower voltage isolation characteristic may be enabled by the described configurations of the differential amplifier 450. For example, the use of amplifiers 481 may be based at least in part on limiting the charge sharing between the sense component 130-b and the memory cell 105-b enabled by the described configurations of the differential amplifier 450.

The amplifier 481-a may be coupled with a voltage source 410-n via a switching component 420-j having the relatively lower voltage isolation characteristic, and the switching component 420-j may be activated or deactivated by a logical signal $SW_{14}$. The voltage source 410-n may have a voltage $V_{13}$, which may represent a low sense amplifier source voltage of the sense component 130-b. The amplifier 481-b may be coupled with a voltage source 410-o via a switching component 420-k having the relatively lower voltage isolation characteristic, and the switching component 420-k may be activated or deactivated by a logical signal $SW_{15}$. The voltage source 410-o may have a voltage $V_{14}$, which may represent a sense amplifier ground voltage of the sense component 130-b, and may be coupled with a same ground or virtual ground as, for example, voltage source 410-a, voltage source 410-b, voltage source 410-d, voltage source 410-f, voltage source 410-h, voltage source 410-l, or a combination thereof.

In some examples, the voltage $V_{13}$ of the voltage source 410-n may be relatively lower than a voltage of other latch configurations, and the use of the relatively lower voltage of the voltage source 410-n may be enabled by the described configurations of a differential amplifier 450. In other words, by using the described configurations of a differential amplifier 450, a sense component 130 may be able to use lower voltage supplies, which may enable the lower power consumption associated with such supplies, and avoid charge leakage associated with relatively higher voltage supplies.

In some examples, activating $SW_{14}$, $SW_{15}$, or both may be referred to as "enabling" or "activating" the sense component 130-b. In some examples, activating $SW_{14}$, $SW_{15}$, or both may be referred to, or be part of an operation known as "latching" the result of accessing the memory cell 105-b. In some examples, logical signals $SW_{14}$ and $SW_{15}$ may be provided by the same logical signal (e.g., by a memory controller), or logical signals $SW_{14}$ and $SW_{15}$ may be shared in a different manner, or logical signals $SW_{14}$ and $SW_{15}$ may otherwise be substantially the same logical signal.

In various examples, the switching components 420 or the selection components 430 illustrated in or coupled with the high voltage portion 470 may be transistors, and the respective logical signals may be supplied to the gate terminal of the respective transistor. In such examples, the transistors of the switching components 420 or the selection components 430 may have substantially the same voltage isolation characteristics as the n-type transistors 472-a and 472-b, or the p-type transistors 471-a and 471-b. For example, the gate insulation thickness of the transistors of the switching component 420-i or the selection components 430-c or 430-d may be substantially the same as, or at least as thick as a minimum thickness of the relatively high gate insulation thickness of the n-type transistors 472 or the p-type transistors 471.

Additionally or alternatively, the switching components 420 or the selection components 430 illustrated in or coupled with the low voltage portion 480 may be transistors and the respective logical signals may be supplied to the gate terminal of the respective transistor. In such examples, the transistors of the switching components 420 or the selection components 430 may have substantially the same voltage isolation characteristics as the amplifiers 481-a or 481-b. For example, the gate insulation thickness of the transistors of switching components 420-h, 420-j, or 420-k may be substantially the same as, or at least as thick as the minimum thickness of the insulation of the amplifiers 481, which may be less than the relatively high gate insulation thickness of the n-type transistors 472 or the p-type transistors 471.

Although the sense component 130-b is illustrated as having a high voltage portion 470 and a low voltage portion 480, various other configurations of a sense component 130 may be used to support the described differential amplifier schemes for sensing memory cells. For example, an amplifier component 280 may be coupled with a sense component 130 having components with substantially the same voltage isolation characteristics throughout the sense component 130. Additionally or alternatively, an amplifier component 280 may be provided with other signal generation components that support accessing a memory cell 105 that are not shown in circuit 400. For example, such additional components may be located (e.g., coupled) between a memory cell 105 and the amplifier component 280, between a sense component 130 and the amplifier component 280, along a bypass line 270, electrically in parallel with the amplifier component 280, or various combinations thereof.

Although the sense component 130-b, the amplifier component 280-a, and the variable voltage sources 440 are illustrated with respective dashed lines as reflecting particular boundaries, such boundaries are shown for illustrative purposes only. In other words, any one or more of a sense component 130, an amplifier component 280, or a variable voltage source 440 in accordance with the present disclosure may have boundaries different than the dashed boundaries shown in the circuit 400. For example, a sense component 130 may have a first node 131 and a second node 132 substantially at the boundary of the sense component 130, such that a common access line is divided into separate branches outside the sense component 130. Further, in some examples, a sense component 130 or an amplifier component 280 may or may not include voltage sources or other voltage supplies, such that the voltage sources or voltage supplies may be within the illustrative boundaries or outside the illustrative boundaries.

Each of the logical signals (e.g., $SW_1$ through $SW_{16}$ and WL) illustrated in circuit 400 may be provided by a memory controller (not shown), such as a memory controller 150 described with reference to FIG. 1. In some examples, certain logical signals may be provided by other components. For example, logical signal WL may be provided by a row decoder (not shown), such as a row decoder 125 described with reference to FIG. 1.

In some examples, the voltage sources 410-n and 410-o may be selected according to particular input or output parameters. For example, voltage sources 410-n and 410-o may be substantially at 1V and 0V (e.g., $V_{13}$=1V and $V_{14}$=0V), which may support certain I/O component conventions such as certain DRAM or FeRAM conventions.

In various examples, voltage sources 410 may be coupled with different configurations of voltage supplies and/or common grounding or virtual grounding points of a memory device that may include the example circuit 400. For example, in some embodiments, voltage sources 410-a, 410-b, 410-d, 410-f, 410-h, 410-l, or 410-o, or any combination thereof, may be coupled with the same ground point or virtual ground point, and may provide substantially the same reference voltage for various operations of accessing the memory cell 105-b.

In some examples, two or more of the voltage sources 410 may be coupled with a same voltage supply of a memory device. For example, two or more of voltage sources 410-c, 410-k, and 410-m may be coupled with a same voltage supply having a certain voltage (e.g., a voltage of 1.5V, which may be referred to as "VMSA"). Accordingly, in some examples, the voltage sources 410-c, 410-k, and 410-m may all be coupled with the same voltage supply (e.g., $V_2$, $V_{10}$, and $V_{12}$ may be substantially equal).

Although voltage sources 410 may be coupled with common voltage supplies and/or grounding points, the voltage at each of the voltage sources 410 coupled with a common voltage supply or common grounding point may be different due to various differences in the circuit 400 (e.g., conductor length, conductor width, conductor resistance, conductor or other capacitance) between the respective voltage sources 410 and the associated common voltage supply or common grounding point.

Figure 5:
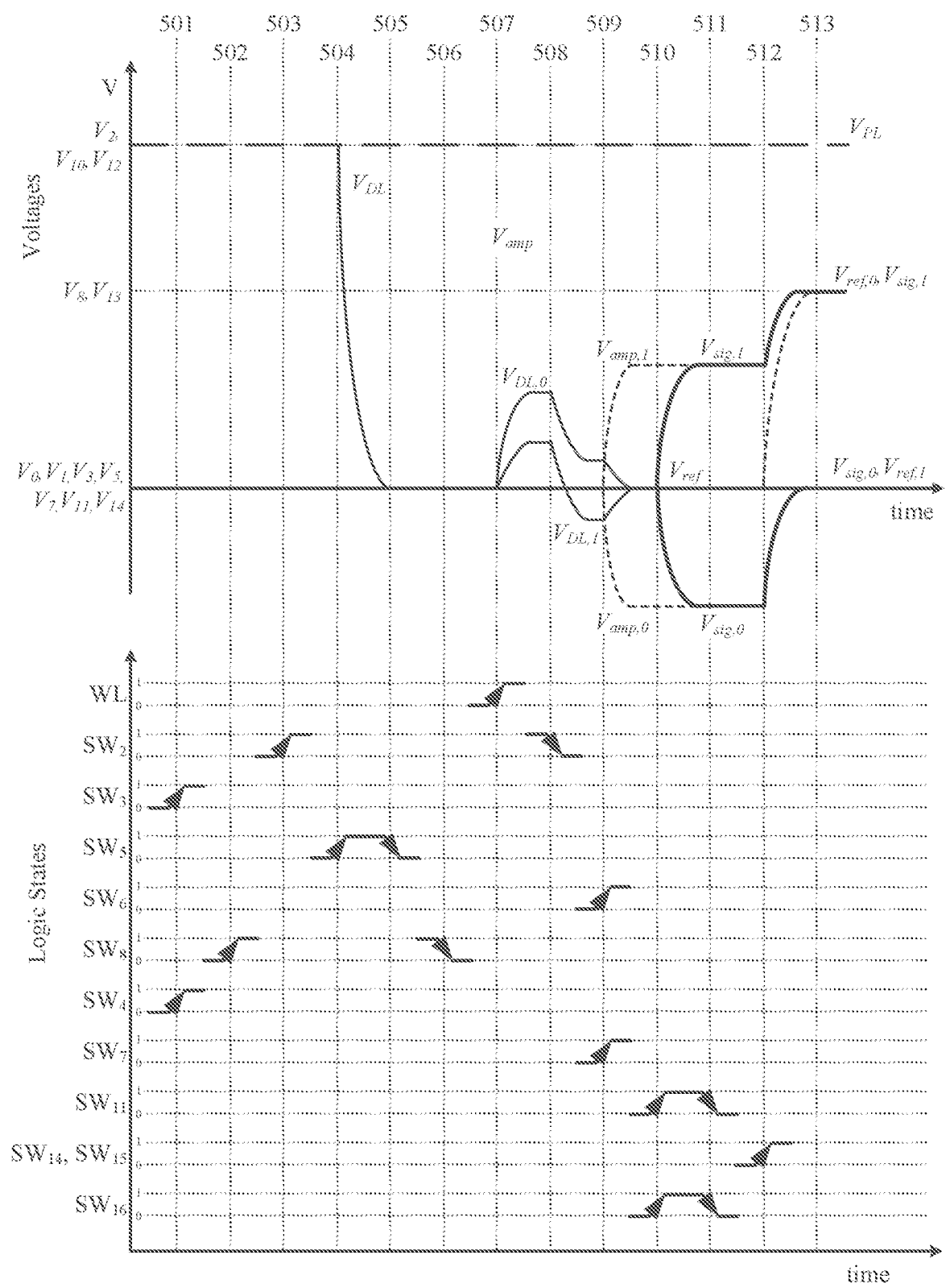
FIG. 5 shows a liming diagram illustrating operations of an example access procedure that supports differential amplifier schemes for sensing memory cells in accordance with examples as disclosed herein.

FIG. 5 shows a timing diagram 500 illustrating operations of an example access procedure that supports differential amplifier schemes for sensing memory cells in accordance with examples as disclosed herein. The timing diagram 500 is described with reference to components of the example circuit 400 of FIG. 4, but may be illustrative of operations that may be performed with different circuit arrangements as well.

In the example of timing diagram 500, memory cell 105-b may initially store a logic state (e.g., a logic 0 state, a logic 1 state) as described herein (e.g., with reference to FIG. 3). The signals of the read operation illustrated in the timing diagram 500 are therefore shown as alternatives associated with reading the different logic states, as indicated by a subscript 0 or a subscript 1 (e.g., as associated with the respective logic states) where such signals are different.

In the example of timing diagram 500, voltage sources 410-a, 410-b, 410-d, 410-f, 410-h, 410-l, and 410-o may be grounded (e.g., according to a ground or virtual ground), and are therefore at a zero voltage (e.g., $V_0$=0V, $V_1$=0V, $V_3$=0V, $V_5$=0V, $V_7$=0V, $V_{11}$=0V, and $V_{14}$=0V). However, in other examples of self-referencing read operations in accordance with the present disclosure, voltage sources 410-a, 410-b, 410-d, 410-f, 410-h, 410-l, and 410-o may be at non-zero voltages, and the voltages illustrated by the timing diagram 500 may thus be adjusted accordingly.

In some examples, before initiating the operations of timing diagram 500, the differential amplifier 450 may be enabled. For example, before the operations of timing diagram 500, the switching component 420-c may be activated (e.g., by activating logical signal $SW_6$), which may couple the high differential amplifier supply voltage (e.g., voltage source 410-i) with the differential amplifier 450. Additionally or alternatively, before the operations of timing diagram 500, the switching component 420-d may be activated (e.g., by activating logical signal $SW_7$), which may couple the low differential amplifier supply voltage (e.g., voltage source 410-j) with the differential amplifier 450. In some examples, either the switching component 420-c or the switching component 420-d may be omitted, such that enabling the differential amplifier may involve one switching component 420. In other examples, both the switching component 420-c and the switching component 420-d may be omitted from the circuit 400, in which case the differential amplifier 450 may always be enabled (e.g., when the corresponding voltage sources are enabled or activated). Alternatively, in some examples, the differential amplifier may be disabled before the operations of timing diagram 500, and enabled during the operations of timing diagram 500 (e.g., at 500), which may reduce power consumption as compared with other techniques.

In some examples, before initiating the operations of timing diagram 500, the digit line 210 for idle memory cells 105 (e.g., deselected memory cells 105 of a memory array that may include the memory cell 105-b), including digit line 210-a, and the plate line 215-a (which may be shared among the memory cells 105 that include the memory cell 105-b) may be controlled to the same voltage. Matching the voltage of digit lines 210 and plate lines 215 may minimize charge leakage in a memory array that includes memory cell 105-b. For example, in the example of timing diagram 500, the digit line 210-c may have an initial voltage of 1.5V (e.g., as provided by voltage source 410-k), which may be the same as the initial voltage of the plate line 215-c (e.g., as provided by voltage source 410-c). In some examples, an idle voltage before the operations of timing diagram 500 may be different, such as a ground voltage (e.g., 0V), and an intervening step before the operations of timing diagram 500 may include collectively raising the voltage of digit lines 210 and plate lines 215.

In some examples, the read operation illustrated by timing diagram 500 may begin with an initial state in which the word line is not selected (e.g., logical signal WL is deactivated), and the differential amplifier 450 is decoupled from the digit line 210-a (e.g., logical signal $SW_4$ is deactivated, logical signal $SW_3$ is deactivated).

At 501, the read operation may include coupling the digit line 210-a with the first input node 451 of the differential amplifier 450. For example, at 501, the read operation may include activating the selection component 431-d (e.g., by activating logical signal $SW_4$), which may decouple the bypass line 270-a from the digit line 210-a. Additionally or alternatively, at 501, the read operation may include activating the switching component 420-a (e.g., of a digit line multiplexer, by activating logical signal $SW_3$). Thus, as a result of the operations of 501, the digit line 210-a, the first input node 451, or a combination thereof (e.g., including various intervening or otherwise electrically equivalent portions of access lines), may be referred to as, or may be electrically equivalent to, a common access line or common node.

At 502, the read operation may include coupling the output node 453 of the differential amplifier 450 with the first input node 451 of the differential amplifier 450. For example, at 502, the read operation may include activating the switching component 420-e (e.g., by activating logical signal $SW_8$), which stay couple the output node 453 with the first input node 451. The operations of 502 may be an example of operations that support coupling a first input node of a differential amplifier with an output node of the differential amplifier via a direct connection or feedback line. In some cases, the operations of 502 may be an example of equalizing the first node 461 and the second node of the integrator capacitor 460, or discharging the capacitive feedback of the deferential amplifier 450.

In another example, an idle state of the circuit 400 may be associated with the output node 453 of the differential amplifier 450 being coupled with the first input node 451 of the differential amplifier 450. In other words, before a read operation, the switching component 420-e may already be activated (e.g., where logical signal $SW_8$ being in an activated state is an initial condition of a read operation). In such examples, the operations of 502 may be omitted.

At 503, the read operation may include coupling the second node 467 of the reference capacitor 465 with a precharge voltage source (e.g., precharging the reference capacitor 465, developing a reference charge at the capacitor 465). For example, at 503, the read operation may include activating the selection component 430-b (e.g., by activating logical signal $SW_2$), which may couple the second node 467 of the reference capacitor 465 with the voltage source 410-e. As a result of the operations of 503, the second node 467 of the reference capacitor may reach the voltage of $V_4$. The operations of 503 may be an example of operations that support biasing or precharging a capacitor of a memory device, where a first node of the capacitor is coupled with a first input node of a differential amplifier or an access line of the memory device (e.g., where the first node 466, the first input node 451, and the digit line 210-a may be referred to as or be otherwise electrically equivalent to a common node or access line). For example, the operations of 503 may be an example of coupling a second node of such a capacitor with a voltage source for biasing or precharging the capacitor.

At 504, the read operation may include equalizing the digit line 210-a, the first input node 451 of the differential amplifier 450, or the combination thereof (e.g., grounding or virtually grounding the digit line 210-a, the first input node 451, or an access line or node that is otherwise associated with or common with the first input node 451). Moreover, as a result of the coupling of 502, at 504, the read operation may also include equalizing the output node 453 of the differential amplifier 450 (e.g., which may or may not have been previously equalized). For example, at 504, the read operation may include activating, the switching component 420-b (e.g., by activating logical signal $SW_5$), which may couple the equalization voltage source (e.g., voltage source 410-f) with the digit line 210-a, the first input node 451, and the output node 453. Thus, at 503, the voltage of the digit line 210-a (e.g., $V_{DL}$) associated with the memory cell 105-b may be brought to an equalization voltage (e.g., 0V), and the voltage of the output node 453 (e.g., $V_{amp}$) associated with the differential amplifier 450 may be brought to the equalization voltage.

As a result of the operations of 504, or a combination of the operations of 503 and 504, the reference capacitor 465 may store a charge associated with the voltage difference of $(V_4-V_5)$. Thus, in some examples, the operations of 504, or a combination of the operations of 503 and 504, may be an example of operations that support biasing or precharging a capacitor coupled with an input of a differential amplifier, or developing a reference charge at a capacitor of a memory device that is coupled with an input of a differential amplifier. In some examples, the digit lines 210 associated with memory cells 105 that are not being read may remain at a first voltage (e.g., an "idle" voltage) through 504 (e.g., may remain at a voltage $V_2$ or $V_{10}$ after the operations of 504, may remain at a voltage $V_2$ or $V_{10}$ throughout the read operation of the timing diagram 500).

In some examples, the operations of 503, the operations of 504, or a combination thereof may be referred to as developing or injecting a reference charge, which, for illustrative purposes may be referred to as injecting a reference charge into the digit line 210-a. The reference charge may thus be compared with the charge stored at, or transferred by, the memory cell 105-b. In some examples, the equilibrium voltage for the reference capacitor 465 and the memory cell 105-b (e.g., 0V) may be both the starting voltage for read window development (e.g., at the first input node 451 of the differential amplifier 450 before the operations of 507), and the voltage equivalent to the reference (e.g., at the second input node 452 of the differential amplifier 450, at the first input node 451 of the differential amplifier after the operations of 409). In examples where the memory cell 105-b provides a charge exactly equal to the reference charge, the voltage of the digit line 210-a may not move, such that a voltage the digit line 210-a during later signal development operations may not be dependent on digit line capacitance (e.g., intrinsic capacitance 240-a).

In another example, an idle state of the circuit 400 may be associated with the first input node 451 of the differential amplifier 450 being coupled with an equalization voltage source (e.g., voltage source 410-f). In other words, before a read operation, the switching component 420-b may already be activated (e.g., where logical signal $SW_5$ being in an activated state is an initial condition of a read operation). In such examples, the operations of 504 may be omitted.

At 505, the read operation may include isolating the digit line 210-a, the first input node 451 of the differential amplifier 450, or the output node 453 of the differential amplifier 450, or the combination thereof, from the equalization voltage source. For example, at 505, the read operation may include deactivating the switching component 420-b (e.g., by deactivating logical signal $SW_5$), which may decouple the digit line 210-a, the first input node 451, and the output node 453 from the voltage source 410-f. Following the operations of 505, the digit line 210-a, the first input node 451, and the output node 453 may hold at the voltage of $V_5$.

At 506, the read operation may include isolating the output node 453 of the differential amplifier 450 from the first input node 451 of the differential amplifier 450. For example, at 506, the read operation may include deactivating the switching component 420-e (e.g., by deactivating logical signal $SW_8$), which may decouple the output node 453 from the first input node 451. In some examples, the operations of 506 may be referred to as isolating or disabling a direct feedback line of the differential amplifier 450. The operations of 506 may be an example of decoupling a first input node of a differential amplifier from an output node of the differential amplifier via a feedback line.

At 507, the read operation may include selecting the memory cell 105-b. For example, at 507, the read operation may include activating a cell selection component 230 of the memory cell 105-b (e.g., by activating logical signal WL). Selecting the memory cell 105-b may cause a capacitor 220 of the memory cell 105-b to be coupled with the digit line 210-a and the first input node 451 of the differential amplifier 450. Accordingly, the voltage applied across the capacitor (e.g., $V_{cap}$ described with reference to FIG. 3) may initially be equal to ($V_{DL}$-$V_{PL}$), a negative $V_{cap}$ that may be referred to as a "plate-high" read operation.

As a result of the operations of 507, charge may be shared among the memory cell 105-c, the digit line 210-a and any intrinsic capacitance of the digit line 210-a (e.g., intrinsic capacitance 240-a), and the reference capacitor 465. The amount of charge shared between the components of the circuit 400 may depend on the logic state (e.g., charge, polarization) stored in the memory cell 105-b. Charge may be accordingly shared among the memory cell 105-b, the reference capacitor 465, and the digit line 210-a until reaching an equilibrium digit line voltage $V_{DL}$ for the given plate line voltage $V_{PL}$ (e.g., $V_2$). The operations of 567 may be an example of coupling a memory cell with the first input node 451 or, more generally, coupling a memory cell with an access line, which may refer to the digit line 210-a, the first input node 451, or a combination thereof (e.g., when the digit line 210-a and the first input node 451 may be electrically equivalent).

For example, when the memory cell 105-b stores a logic 1, the capacitor of the memory cell 105-b may store a positive charge by way of a positive polarization (e.g., a charge state 305-a as described with reference to FIG. 3). Thus, when memory cell 105-b storing a logic 1 is selected at 507, a relatively small amount of charge may flow from the memory cell 105-b to the digit line 210-a. The relatively small amount of charge flowing to the digit line 210-a may accordingly result in a relatively small rise in digit line voltage $V_{DL,1}$.

Alternatively, when the memory cell 105-b stores a logic 0, the capacitor of the memory cell 105-b may store a negative charge by way of a negative polarization (e.g., a charge state 310-a as described with reference to FIG. 3). Thus, when memory cell 105-b storing a logic 0 is selected at 507, a relatively large amount of charge may flow from the memory cell 105-b to the digit line 210-a. The relatively large amount of charge flowing to the digit line 210-a may accordingly result in a relatively large rise in digit line voltage $V_{DL,0}$.

At 508, the read operation may include modifying a bias (e.g., by the variable voltage source 440-b) to the reference capacitor 465. For example, at 508, the read operation may include decoupling the second node 467 of the reference capacitor 465 from the precharge voltage source 410-e, and alternatively coupling the second node 467 with the voltage source 410-d (e.g., by deactivating logical signal $SW_2$). As a result of the operations of 508, the second node 467 of the integrator capacitor may reach the voltage of $V_3$, which may be a ground voltage (e.g., 0V), and may further be equal to a bias of the second input node 452 of the differential amplifier. The operations of 508 may be an example of operations that support biasing a capacitor of a memory device, where a first node of the capacitor is coupled with a first input node of a differential amplifier or an access line of the memory device. For example, the operations of 503 may be an example of coupling a second node of such a capacitor with a voltage source for equalizing a node 467 of the capacitor 465.

As a result of the operations of 508, the voltage of the second node 467 of the reference capacitor 465 may drop, and the voltage of the digit line 210-a may also drop as charge is shared between the digit line 210-a and the reference capacitor 445, or among the digit line 210-a, the reference capacitor 465, and the memory cell 105-b. For example, when the memory cell 105-b stored a logic 0, the voltage of the digit line 210-a may drop to a level $V_{DL,0}$ that is above the ground voltage. Alternatively, when the memory cell 105-b stored a logic 0, the voltage of the digit line 210-a may drop to a level $V_{DL,1}$ that is below the ground voltage. In some examples, the capacitance of the reference capacitor 465, a voltage (e.g., $V_4$) of the variable voltage source 440-b, or both, may be configured such that the digit line voltage after the operations of 508 when reading a logic 0 (e.g., $V_{DL,0}$, a positive voltage) is opposite from the digit line voltage after the operations of 508 when reading a logic 1 (e.g., $V_{DL,1}$, a negative voltage) relative voltage of the second input node 452 of the differential amplifier 450 (e.g., 0V). In some cases, the capacitance of the reference capacitor 465, a voltage (e.g., $V_4$) of the variable voltage source 440-b, or both, may be configured such that the voltage of the second input node 452 of the differential amplifier 450 (e.g., 0V) is generally an average of the digit line voltage after the operations of 508 when reading a logic 0 (e.g., $V_{DL,0}$) and the digit line voltage after the operations of 508 when reading a logic 1 (e.g., $V_{DL,1}$).

At 509, the read operation may include enabling the differential amplifier 450. For example, at 509, the read operation may include activating the switching component 420-c (e.g., by activating logical signal $SW_6$), which may couple the high differential amplifier supply voltage (e.g., voltage source 410-i) with the differential amplifier 450. Additionally or alternatively, in some examples, at 509, the read operation may include activating the switching component 420-d (e.g., by activating logical signal $SW_7$), which may couple the low differential amplifier supply voltage (e.g., voltage source 410-j) with the differential amplifier 450. In some examples, one of the switching component 420-c or the switching component 420-d may be activated before the operations of 503, or either the switching component 420-c or the switching component 420-d may be omitted, such that enabling the differential amplifier may include one switching, component 420 to be activated at 509. Thus, according to various examples, the differential amplifier 450 may, at 509, be enabled for generating a signal at the output node 453 that is based at least in part on a difference between the first input node 451 and the second input node 452.

In an example where the memory cell 105-b stored a logic 0, a voltage at the first input node 451 (e.g., $V_{DL,0}$) at 509 may be greater than a voltage of the second input node (e.g., $V_7$, which may be equal to 0V). In response to the difference in voltage at the input nodes 451 and 452, the differential amplifier 450 may support a negative current at the output node 453 (e.g., charge flowing into the output code 453). The negative current may be supported by charge flowing out from the second node 462 of the integrator capacitor 460, through the differential amplifier 450, and into the differential amplifier low voltage source 410-j (e.g., a negative voltage source). In response to the drop in voltage at the second node 462 of the integrator capacitor 460, charge may flow from the digit line 210-a into the first node 461 of the integrator capacitor 460, and accordingly $V_{DL}$ may also drop. The negative current may continue until the voltage at the first input node 451 and the voltage at the second input node 452 equalize (e.g., when the digit line voltage $V_{DL}$ falls to 0V, when the digit line voltage $V_{DL}$ matches the differential amplifier reference voltage $V_7$). Accordingly, the voltage at the second node 462 of the integrator capacitor 460 (e.g., an output voltage of the differential amplifier 450, a voltage of the output node 453, $V_{amp,0}$) may drop below the previously-equalized voltage to a negative voltage.

In an example where the memory cell 105-b stored a logic 1, a voltage at the first input node 451 (e.g., $V_{DL,1}$) at 509 may be less than a voltage of the second input node (e.g., $V_7$, which may be equal to 0V). In response to the difference in voltage at the input nodes 451 and 452, the differential amplifier 450 may support a positive current at the output node 453 (e.g., charge flowing out of the output node 453). The positive current may be supported by charge flowing out from differential amplifier 450 (e.g., as supported by the differential amplifier high voltage source 410-i, a positive voltage source) and into the second node 462 of the integrator capacitor 460. In response to the rise in voltage at the second node 462 of the integrator capacitor 460, charge may flow from the first node 461 of the integrator capacitor 460 into the digit line 210-a, and accordingly $V_{DL}$ may also rise. The positive current may continue until the voltage at the first input node 451 and the voltage at the second input node 452 equalize (e.g., when the digit line voltage $V_{DL}$ rises to 0V, when the digit line voltage $V_{DL}$ matches the differential amplifier reference voltage $V_7$). Accordingly, the voltage at the second node 462 of the integrator capacitor 460 (e.g., an output voltage of the differential amplifier 450, a voltage of the output node 453, $V_{amp,1}$) may rise above the previously-equalized voltage to a negative voltage.

In accordance with examples as disclosed herein, enabling the differential amplifier 450 at 509 may provide certain advantages over other techniques for signal development with differential amplifiers. For example, certain architectures for differential amplifiers may have non-ideal gain characteristics, or output resistances that are not high enough to overcome other sensitivities or variabilities in a sensing circuit (e.g., related to drain-source resistance or transistor channel modulation effects). In read operations where output voltages are not centered around an equilibrium voltage (e.g., 0V), for example, nonlinear output characteristics or otherwise insufficiently high output resistances may result in unfavorable reductions in read margins or otherwise unpredictable effects to a read window budget. By operating around an equilibrium voltage (e.g., where a voltage at the output node 453 is positive or negative, or otherwise centered around 0V), the effect of non-ideal gain or output resistance of the differential amplifier may be reduced or eliminated. In other words, because the starting voltage for read window development (e.g., a voltage of the output node 453 prior the operations of 509, a voltage of the second input node 452) is the same as the self-adjusted feedback voltage, the effect of deferential amplifier output resistance may be mitigated.

Further, the described examples for an amplifier component 280 (e.g., amplifier component 280-a) may leverage an integrator capacitor 460 having a capacitance that is non-linear with respect to voltage, which may improve read margins when considering memory cells 105 that may be weakly charged or strongly charged. For example, the gain or total amplification factor of the amplifier component 280-a may be related to or equal to a ratio of the signal $V_{amp}$ after the operations of 509 to the signal $V_{DL}$ before the operations of 509. Because a magnitude of $V_{DL}$ before the operations of 509 may be related to a strength of charge at a memory cell 105, a magnitude of $V_{amp}$ after the operations of 509 may also be related to a strength of charge at the memory cell 105 (e.g., according to the gain of the amplifier component 280-a). To simultaneously support relatively high gain for weakly charged memory cells 105 (e.g., to improve read margins) and relatively low gain for strongly charged memory cells 105 (e.g., to avoid saturation, to avoid a magnitude of from becoming too high), the described techniques for differential amplifier schemes may implement an integrator capacitor 460 having relatively low capacitance at low voltages, and relatively high capacitance at relatively high voltage. However, in other examples, an integrator capacitor 460 may be configured with a capacitance that is linear with respect to voltage, or hits some other capacitance characteristic.

At 510, the read operation may include coupling the amplifier component 280-a with the sense component 130-b. For example, at 510, the read operation may include activating the switching component 420-h (e.g., by activating logical signal $SW_{11}$), which may couple the output node 453 of the differential amplifier 450 with the signal node (e.g., first node 131-b) of the sense component 130-b. Thus, as a result of the operations of 510, the first node 131-b of the sense component 130-b may reach a signal voltage based at least in part on the signal generated at the output node 453 of the differential amplifier 450. For example, charge may be shared between the amplifier component 280-a and the sense component 130-b such that the voltage at the first node 131-b (e.g., $V_{sig}$) reaches the voltage at the output node 453 of the differential amplifier 450 (e.g., $V_{amp}$). As a result of the configuration of the differential amplifier 450, charge sharing between the memory cell 105-b and the sense component 130-b may be reduced, or substantially eliminated, as compared with other circuit configurations used to read a memory cell.

Further, at 510, the read operation may also include activating the switching component 420-l (e.g., by activating logical signal $SW_{16}$), which may couple the first input node 451 of the differential amplifier 450 with the reference node (e.g., second node 132-b) of the sense component 130-b. Thus, as another result of the operations of 510, the second node 132-b of the sense component 130-b may reach a signal voltage based at least in part on the signal at the first input node 451 of the differential amplifier 450. Because the differential amplifier 450 is configured to equalize the voltage between the first input node 451 and the second input node 452, and the second input node 452 may be held to the voltage $V_7$ (e.g., 0V), the second node 132-b of the sense component 130-b may accordingly be driven to the same voltage $V_7$ (e.g., 0V).

At 511, the read operation may include isolating the amplifier component 280-a from the sense component 130-b. For example, at 511, the read operation may include deactivating the switching component 420-h (e.g., by deactivating logical signal $SW_{11}$), which may isolate the output node 453 of the differential amplifier 450 from the first node 131-b of the sense component 130-b. Further, at 511, the read operation may include deactivating the switching component 420-l (e.g., by deactivating logical signal $SW_{16}$), which may isolate the first input node 451 of the differential amplifier 450 from the second node 132-b of the sense component 130-b.

At 512, the read operation may include latching the result of detecting the logic state stored by the memory cell 105-b. For example, at 512, the read operation may include activating the switching components 420-j and 4204c (e.g., by activating logical signals $SW_{14}$ and $SW_{15}$), which may couple the sense component voltage source 410-n with the amplifier 481-a and couple the sense component voltage source 410-o with the amplifier 481-b. As a result of the operations of 512, the first node 131-b and the second node 132-b may reach one of the voltages provided by the sense component voltage sources 410, depending on the detected logic state stored by the memory cell 105-b.

For example, when the memory cell 105-b stores a logic 1, $V_{sig,1}$ may be higher than $V_{ref}$. Thus, when reading a logic 1, $V_{sig,1}$ may change (e.g., rise) to match the relatively higher amplifier source voltage $V_{13}$ and $V_{ref,1}$ may change (e.g., rise) to match the relatively lower amplifier source voltage $V_{14}$. When the memory cell 105-b stores a logic 0, $V_{sig,0}$ may be lower than $V_{ref}$. Thus, when reading a logic 0, $V_{ref,0}$ may change to match the relatively higher amplifier source voltage $V_{13}$ and $V_{ref,0}$ may change to match the relatively lower amplifier source voltage $V_{14}$. The operations of 512 may be an example of determining a logic state stored by a memory cell based at least in part on a generated sense signal.

At 513, signaling corresponding to the detected logic state may be communicated via the I/O lines 290-a and 290-b. For example, an I/O component 140 may read the voltage levels of the I/O lines 290-a and 290-b, and communicate the detected logic state (e.g., to a memory controller 150, to a host device accessing the corresponding memory device).

In various examples of a read operation in accordance with the present disclosure, components or logical signals may be returned to an idle state or transitioned to some other initial condition before a subsequent access operation (e.g., before a subsequent refresh operation, before a subsequent read operation, before a subsequent write operation). In various examples, transitioning to an idle state or other initial condition may be considered to be part of the read operation, or may be referred to as a transitional operation.

In examples where the differential amplifier 450 is disabled or otherwise powered down in an idle state or a subsequent initial condition, the switching component 420-c, the switching component 420-d, or both may be deactivated (e.g., by deactivating one or both of logical signals $SW_6$ or $SW_7$) following the operations illustrated in the timing diagram 500.

In examples where the first input node 451 of the differential amplifier 450 is coupled with the output node 453 of the differential amplifier 450 in an idle state or a subsequent initial condition, the switching component 420-e may be activated (e.g., by activating logical signal $SW_8$) following the operations illustrated in the timing diagram 500.

In examples where the first input node 451 of the differential amplifier 450 is coupled with an equalization voltage source (e.g., voltage source 410-f) in an idle state or a subsequent initial condition, the switching component 420-b may be activated (e.g., by actuating logical signal $SW_5$) following the operations illustrated in the liming diagram 500.

The read operation illustrated by the timing diagram 500 may be an example of a "high voltage idle" operation, in which, before the operations of timing diagram 500, memory cells 105 of an array are held at a relatively high voltage (e.g., via connected digit lines 210 and plate lines 215). For example, before the operations of timing diagram 500, memory cells 105 may be held at a high plate line voltage (e.g., $V_{PL}=V_2$) and a high digit line voltage (e.g., $V_{DL}=V_{10}$). These conditions may be returned to after the read operation illustrated in liming diagram 500. In other words, logical signals $SW_1$ and $SW_{12}$ may be activated following the operations illustrated in the timing diagram 500.

In other examples of read operations that support the described differential amplifier schemes, memory cells 105 may be held at a relatively low voltage or ground voltage. For example, before the operations of timing diagram 500, memory cells 105 may be held at a low plate line voltage (e.g., $V_{PL}=V_1$, which may be a ground voltage) and a low digit line voltage (e.g., $V_{DL}=V_5$ or $V_{12}$, either of which may be a ground voltage).

Although illustrated as separate operations occurring at different times, certain operations may occur simultaneously, or in a different order. In some examples, various operations may be advantageously initiated simultaneously to reduce the amount of time for sensing a logic state of the memory cell 105-b. For example, any two or more of activating the switching component 420-a of 501, activating the selection component 430-d of 501, activating the switching component 420-e of 502, activating the selection component 430-b of 503, or activating the switching component 420-b of 504, may occur in a different relative order, occur during overlapping durations, or occur simultaneously. Additionally or alternatively, any two or more of selecting the memory cell 105-b (e.g., activating the logical signal WL) of 507, deactivating the selection component 430-b of 508, or activating the switching components 420-c and 420-d of 509, may occur in a different relative order, occur during overlapping durations, or occur simultaneously.

The order of operations shown in timing diagram 500 is for illustration only, and various other orders and combinations of steps may be performed to support differential amplifier schemes for sensing memory cells in accordance with the present disclosure. Further, the liming of the operations of the timing diagram 500 is also for illustration purposes only, and is not meant to indicate a particular relative duration between one operation and another. Various operations may occur over a duration that is relatively shorter or relatively longer than illustrated in various differential amplifier schemes for sensing memory cells in accordance with examples as disclosed herein.

The transitions of the logical signals of the timing diagram 500 are illustrative of transitions from one state to another, and generally reflect transitions between a disabled or deactivated state (e.g., suite "0") and an enabled or activated state (e.g., state "1") as associated with a particular numbered operation. In various examples the states may be associated with a particular voltage of the logical signal (e.g., a logical input voltage applied to a gate of a transistor operating as a switch), and the change in voltage from one state to another may not be instantaneous. Rather, in some examples, a voltage associated with a logical signal may follow a ramping behavior, or time-constant (e.g., logarithmic or exponential) behavior over tune from we logical state to another.

In some examples, the transition of a component from one state to another may be based at least in part on characteristics of the associated logical signal, including the voltage level of the logical signal or the transition characteristics of the logical signal itself. Thus, the transitions shown in timing diagram 500 are net necessarily indicative of an instantaneous transition. Further, the initial state of a logical signal associated with a transition at a numbered operation may have been arrived during various times preceding the numbered operation while still supporting the described transitions and associated operations. Although logical signals are shown as a transition between logical states, the voltage of a logical signal may be selected to operate a component at a particular working point (e.g., in an active region or in a saturation region), and may be the same as, or different from a voltage of other logical signals.

Figure 6:
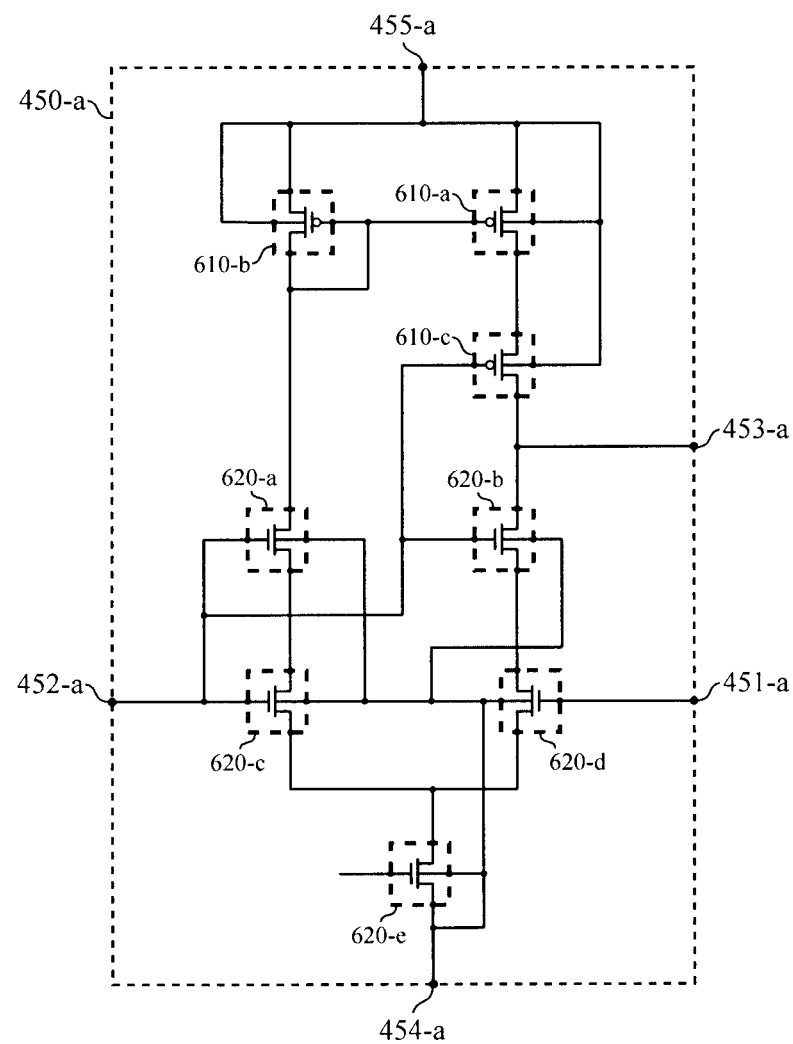
FIG. 6 illustrates a schematic of an example of a differential amplifier that supports differential amplifier schemes for seining memory cells in accordance with examples as disclosed herein.

FIG. 6 illustrates a schematic 600 of an example of a differential amplifier 450-*a* that supports differential amplifier schemes for sensing memory cells in accordance with examples as disclosed herein. The differential amplifier 450-*a* includes a first input node 451-*a*, a second input node 452-*a*, and an output node 453-*a*. The differential amplifier 450-*a* also includes a first supply node 454-*a* that may be configured to be coupled with a low differential amplifier voltage source (e.g., voltage source 410-*j* described with reference to FIG. 4), and a second supply node 455-*a* that may be configured to be coupled with a high differential amplifier voltage source (e.g., voltage source 410-*j* described with reference to FIG. 4).

The differential amplifier 450-*a* may include various transistors that support the described functions of a differential amplifier. For example, the differential amplifier 450-*a* may include p-type transistors 610 (e.g., p-type transistors 610-*a*, 610-*b*, and 610-*c*), and n-type transistors 620 (e.g., n-type transistors 620-*a*, 620-*b*, 620-*c*, 620-*d*, and 620-*e*). In some examples, the differential amplifier 450-*a* may be configured as a transconductance differential amplifier. For example, the differential amplifier 450-*a* may support a current at the output node 453-*a* that is proportional to a difference between a voltage at the first input node 451-*a* and a voltage at the second input node. In some examples, the configuration of the differential amplifier 450-*a* may provide favorable output characteristics, such as a relatively high output resistance. In some examples, such functionality may be supported by the particular configuration of the second input node 452-*a* being coupled or connected with the gates nodes of the p-type transistor 610-*c* and the n-type transistors 620-*a*, 620-*b*, and 620-*c*.

Figure 7:
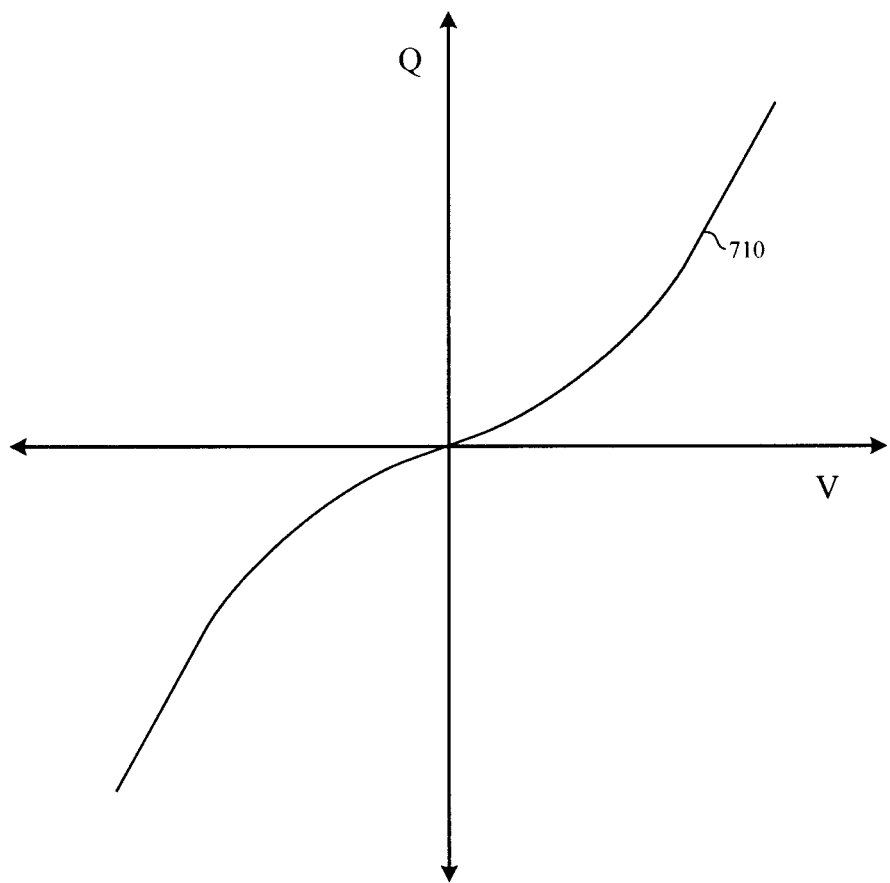
FIG. 7 is an example of a charge plot and example integrator capacitors that illustrate a non-linear capacitance that may support differential amplifier schemes for sensing memory cells in accordance with examples as disclosed herein.
Figure 7:
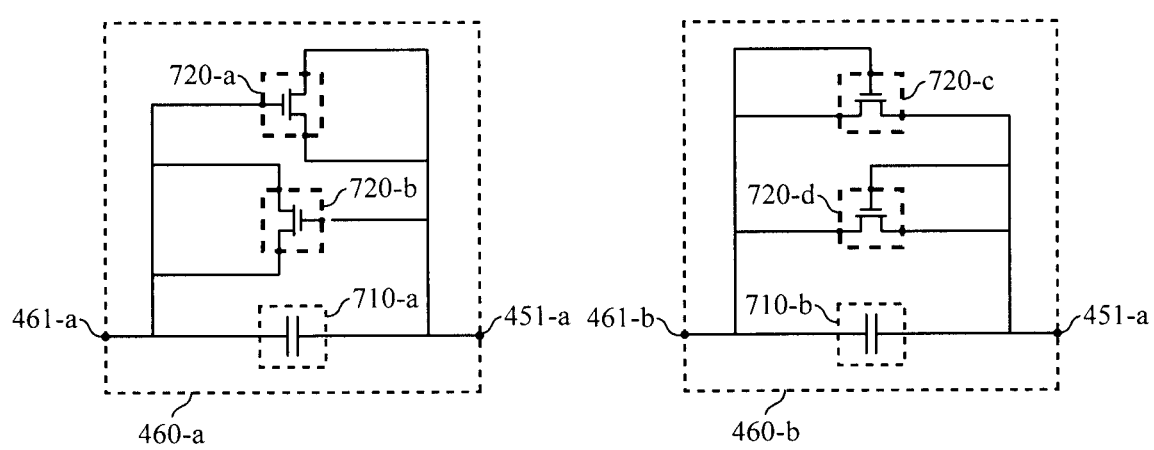

FIG. 7 is an example of a charge plot 700 and example integrator capacitors 460-*a* and 460-*b* that illustrate a nonlinear capacitance that may support differential amplifier schemes for sensing memory cells in accordance with examples as disclosed herein. For example, the charge plot 700 illustrates a charge-voltage relationship 710, which may be illustrative of an accumulated charge, Q, for a given voltage, V. In some examples, the charge-voltage relationship 710 may be illustrative of an integrator capacitor 460, described with reference to FIG. 4, having a capacitance that is nonlinear with respect to voltage.

To support a nonlinear capacitance, a slope of the charge-voltage relationship 710 may be different for different applied voltages. For example, at relatively small magnitudes of voltage (e.g., near zero volts), the slope of the charge-voltage relationship 710 may be relatively shallow, illustrating a relatively low capacitance. At relatively larger magnitudes of voltage (e.g., relatively far from zero volts, a relatively high or low voltage value or magnitude), the slope of the charge-voltage relationship 710 may be relatively sleep, illustrating a relatively high capacitance. In some examples, the capacitance near the equilibrium point (e.g., 0V) of an integrator capacitor 460 may be configured to be as low as allowable in a given design (e.g., considering noise filtering, signal development speed, signal regulation), which may include capacitance that is equal to zero, or nearly equal to zero, around the equilibrium point.

The behavior illustrated by the charge-voltage relationship 710 may be supported with various circuit arrangements. The integrator capacitor 460-*a* illustrates a first example for combining a capacitor 710-*a* (e.g., a linear capacitor, a linearly capacitive element) with a transistor 720-*a* and a transistor 720-*b* to provide a capacitance that is nonlinear with respect to voltage. In some examples, the integrator capacitor 460-*a* may be referred to as a non-linear cap. The integrator capacitor 460-*b* illustrates a second example for combining a capacitor 710-*b* (e.g., a linear capacitor, a linearly capacitive element) with a transistor 720-*c* and a transistor 720-*d* to provide a capacitance that is nonlinear with respect to voltage. In some examples, the integrator capacitor 460-*a* may be referred to as a diode clamp.

Figure 8:
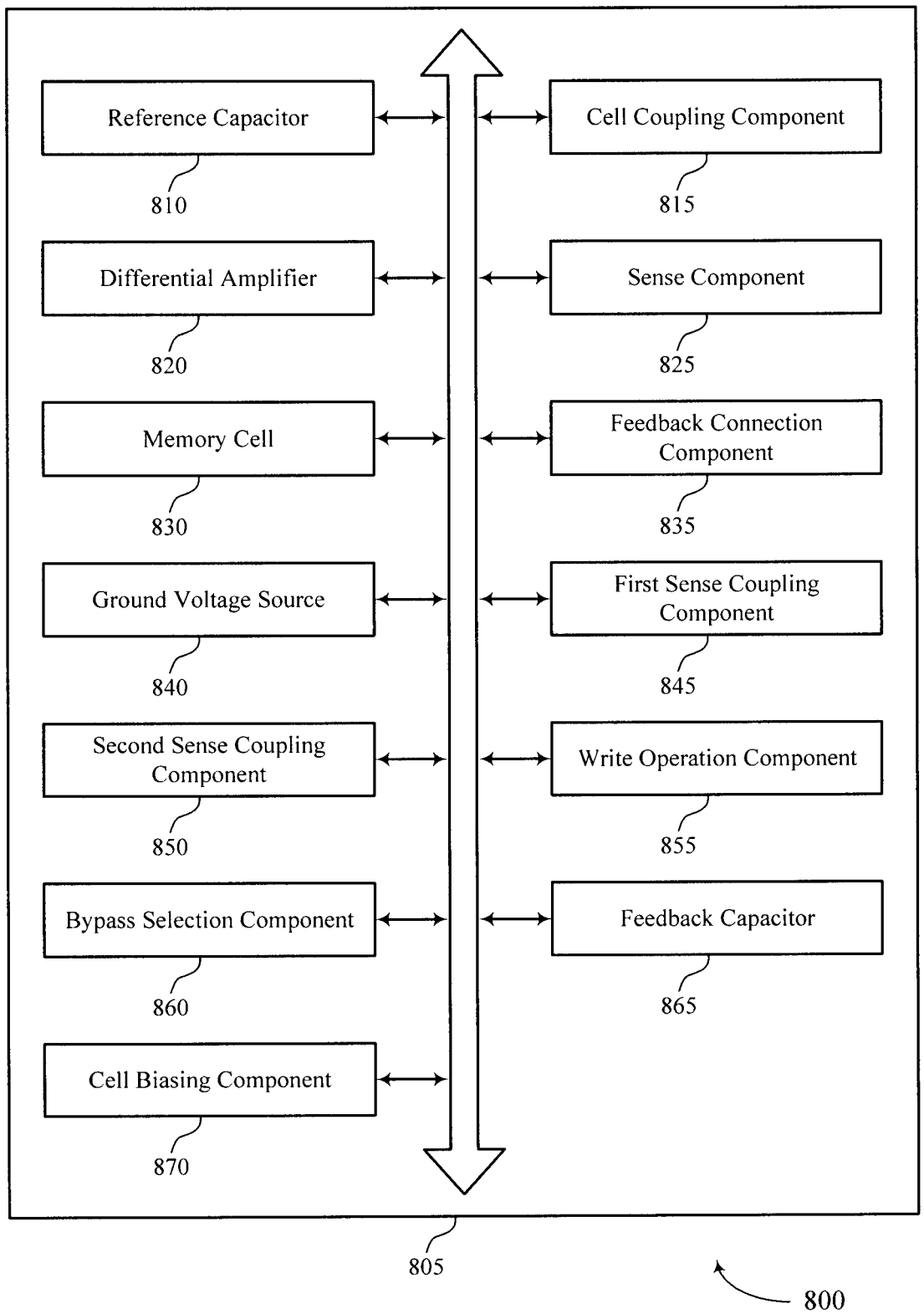
FIG. 8 shows a block diagram of a memory device that supports differential amplifier schemes for sensing memory cells in accordance with aspects of the present disclosure.

FIG. 8 shows a block diagram 800 of a memory device 805 that supports differential amplifier schemes for sensing memory cells in accordance with examples as disclosed herein. The memory device 805 may be an example of aspects of a memory device as described with reference to FIGS. 1 through 7. The memory device 805 may include a reference capacitor 810, a cell coupling, competent 815, a differential amplifier 820, a sense component 825, a memory cell 830, a feedback connection component 835, a ground voltage source 840, a first sense coupling component 845, a second sense coupling component 850, a write operation component 855, a bypass selection component 860, a feedback capacitor 865, and a cell biasing component 870. Each of these modules may communicate, directly or indirectly, with one another (e.g., via one or more buses).

The reference capacitor 810 may be coupled with an access line of the memory device, and may be configured for various biasing in accordance with access operations described herein. In some examples, the reference capacitor 810 may be configured in a similar manner as the reference capacitor 465 described with reference to FIG. 4.

In some examples, the reference capacitor 810 may configured to share charge between the first capacitor and the access line.

The cell coupling component 815 may be operable for coupling a memory cell with the access line. In some examples, the cell coupling component 815 may be configured in a similar manner as the cell selection components 230 described with reference to FIG. 2 or 4.

The differential amplifier 820 may be operable for generating, at an output node of the differential amplifier, a sense signal based on biasing the first capacitor and coupling the memory cell with the access line, where the access line is coupled with an input node of the differential amplifier and the output node it coupled with the input node of the differential amplifier via a second capacitor. In some examples, the differential amplifier 820 may be configured in a similar manner as the differential amplifier 450 described with reference to FIG. 4.

In some cases, the differential amplifier 820 may be configured such that a current at the output node of the differential amplifier is proportional to a difference between a voltage at the input node of the differential amplifier and a voltage at a second input node of the differential amplifier.

The sense component 825 may be operable for determining a logic state stored by the memory cell based on generating the sense signal. In some examples, the sense component 825 may be configured in a similar manner as the sense components 130 described with reference to FIG. 1, 2, or 4.

In some examples, the sense component 825 may be operable for latching a difference between a signal at a first node and a signal at a second node of the sense component.

In some examples, the sense component 825 may be operable for latching the difference between the signal at the first node of the sense component and the signal at the second node of the sense component after coupling the input node of the differential amplifier with the second node of the sense component.

The memory cell 830 may be configured for sharing charge between the memory cell and the access line, and generating a sense signal may be based on sharing charge between the first capacitor and the access line and sharing charge between the memory cell and the access line.

The feedback connection component 835 may be operable for connecting the output node of the differential amplifier with the input node of the differential amplifier before biasing the first capacitor and before coupling the memory cell with the access line. In some examples, the feedback connection component 835 may be configured in a similar manner as the switching component 420-e described with reference to FIG. 4.

In some examples, the feedback connection component 835 may be operable for disconnecting the output node of the differential amplifier from the input node of the differential amplifier after biasing the access line with the ground voltage and before biasing the first capacitor and before coupling the memory cell with the access line.

The ground voltage source 840 may be operable for biasing the access line with a ground voltage while the output node of the differential amplifier is connected with the input node of the differential amplifier.

In some examples, the ground voltage source 840 may be operable for biasing a second input node of the differential amplifier with a ground voltage during the generating of the sense signal. In some examples, the ground voltage source 840 may be configured in a similar manner as the voltage source 410-f described with reference to FIG. 4.

The first sense coupling component 845 may be operable for coupling the output node of the differential amplifier with a first node of a sense component. In some examples, the first sense coupling component 845 may be configured in a similar manner as the switching component 420-h described with reference to FIG. 4.

In some examples, coupling the output node of the differential amplifier with the first node of the sense component includes coupling the output node with a first portion of the sense component, the first portion of the sense component associated with a first voltage isolation characteristic.

The second sense coupling component 850 may be operable for coupling the input node of the differential amplifier with the second node of the sense component. In some examples, the second sense coupling component 850 may be configured in a similar manner as the switching component 420-l described with reference to FIG. 4.

The write operation component 855 may be operable for performing a write operation on the memory cell, where the write operation includes coupling the memory cell with the sense component via an access line that bypasses the differential amplifier.

The bypass selection component 860 may be operable for coupling the memory cell with the sense component via the access line that bypasses the differential amplifier, which may include coupling the memory cell with a second portion of the sense component, the second portion of the sense component associated with a second voltage isolation characteristic that is higher than the first voltage isolation characteristic. In some examples, the bypass selection component 860 may be configured in a similar manner as the selection component 430-d described with reference to FIG. 4.

In some cases, the feedback capacitor 865 may have a capacitance that is non-linear with respect to voltage. In some examples, the feedback capacitor 865 may be configured in a similar manner as the integrator capacitor 460 described with reference to FIG. 4.

The cell biasing component 870 may be operable for biasing the memory cell while the memory cell is coupled with the access line.

Figure 9:
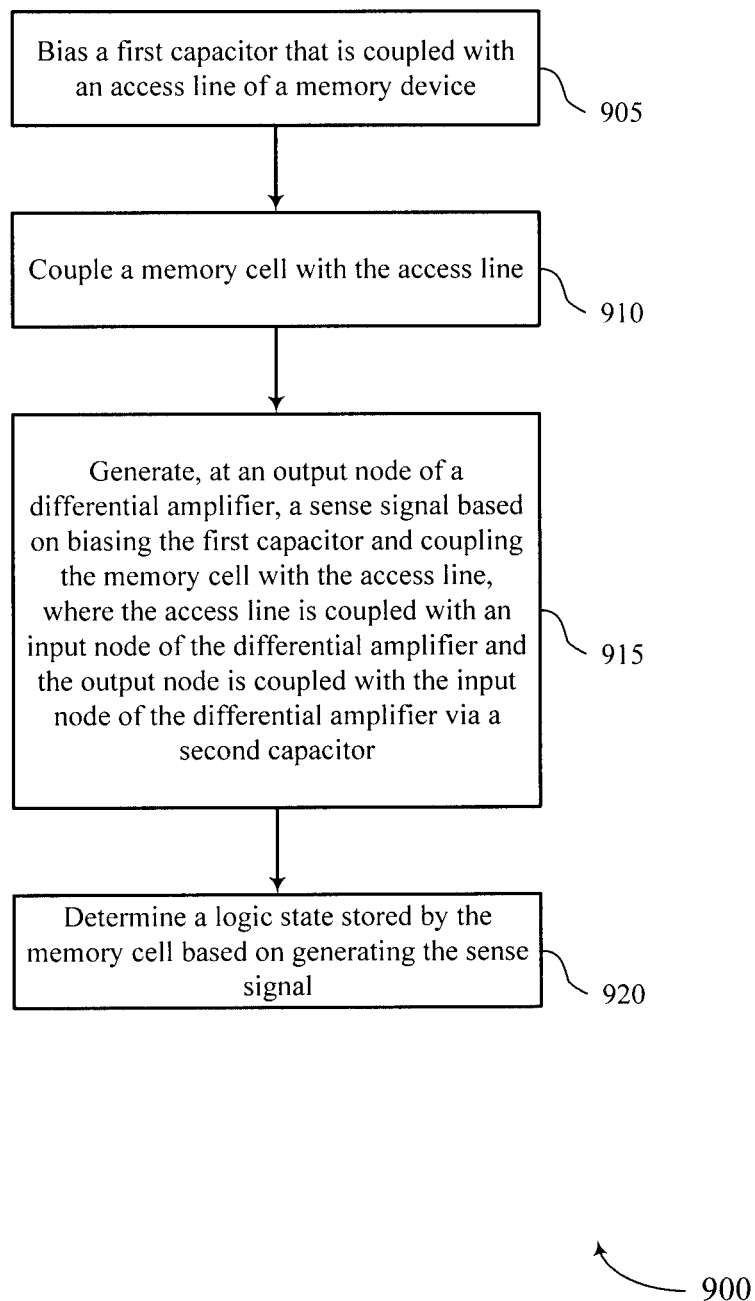
FIG. 9 shows a flowchart illustrating a method or methods that support differential amplifier schemes for sensing memory cells in accordance with examples as disclosed herein.

FIG. 9 shows a flowchart illustrating a method or methods 900 that supports differential amplifier schemes for sensing memory cells in accordance with aspects of the present disclosure. The operations of method 990 may be implemented by a memory device or its components as described herein. For example, the operations of method 900 may be performed by a memory device as described with reference to FIG. 8. In some examples, a memory device may execute a set of instructions to control the functional dements of the memory device to perform the described functions. Additionally or alternatively, a memory device may perform aspects of the described functions using special-purpose hardware.

At 905, the memory device may bias a first capacitor that is coupled with an access line of a memory device. The operations of 905 may be performed according to the methods described herein. In some examples, aspects of the operations of 905 may be performed by a reference capacitor as described with reference to FIG. 8.

At 910, the memory device may couple a memory cell with the access line. The operations of 910 may be performed according to the methods described herein. In some examples, aspects of the operations of 910 may be performed by a cell coupling component as described with reference to FIG. 8.

At 915, the memory device may generate, at an output node of a differential amplifier, a sense signal based on biasing the first capacitor and coupling the memory cell with the access line, where the access line is coupled with an input node of the differential amplifier and the output node is coupled with the input node of the differential amplifier via a second capacitor. The operations of 915 may be performed according to the methods described herein. In some examples, aspects of the operations of 915 may be performed by a differential amplifier as described with reference to FIG. 8.

At 920, the memory device may determine a logic state stored by the memory cell based on generating the sense signal. The operations of 920 may be performed according to the methods described herein. In some examples, aspects of the operations of 920 may be performed by a sense component as described with reference to FIG. 8.

In some examples, an apparatus as described herein may perform a method or methods, such as the method 900. The apparatus may include features, circuitry, means, or instructions (e.g., a non-transitory computer-readable medium storing instructions executable by a processor) for biasing a first capacitor that is coupled with an access line of a memory device, coupling a memory cell with the access line, generating, at an output node of a differential amplifier, a sense signal based on biasing the first capacitor and coupling the memory cell with the access line, where the access line is coupled with an input node of the differential amplifier and the output node is coupled with the input node of the differential amplifier via a second capacitor, and determining a logic state stored by the memory cell based on generating the sense signal.

Some examples of the method 900 and the apparatus described herein may further include operations, features, circuitry, means, or instructions for sharing charge between the first capacitor and the access line, and sharing charge between the memory cell and the access line, and generating a sense signal may be based on sharing charge between the first capacitor and the access line and sharing charge between the memory cell and the access line.

Some examples of the method 900 and the apparatus described herein may further include operations, features, circuitry, means, or instructions for connecting the output node of the differential amplifier with the input node of the differential amplifier before biasing the first capacitor and before coupling the memory cell with the access line, biasing the access line with a ground voltage while the output node of the differential amplifier may be connected with the input node of the differential amplifier, and disconnecting the output node of the differential amplifier from the input node of the differential amplifier after biasing the access line with the ground voltage and before biasing the first capacitor and before coupling the memory cell with the access line.

In some examples of the method 900 and the apparatus described herein, determining the logic state may include operations, features, circuitry, means, or instructions for coupling the output node of the differential amplifier with a first node of a sense component, and latching, at the sense component, a difference between a signal at the first node and a signal at a second node of the sense component.

In some examples of the method 900 and the apparatus described herein, determining the logic state may include operations, features, circuitry, means, or instructions for coupling the input node of the differential amplifier with the second node of the sense component, and latching the difference between the signal at the first node of the sense component and the signal at the second node of the sense component after coupling the input node of the differential amplifier with the second node of the sense component.

Some examples of the method 900 and the apparatus described herein may further include operations, features, circuitry, means, or instructions for performing a write operation on the memory cell, and the write operation may include coupling the memory cell with the sense component via an access line that by passes the differential amplifier.

In some examples of the method 900 and the apparatus described herein, coupling the output node of the differential amplifier with the first node of the sense component may include operations, features, circuitry, means, or instructions for coupling the output node with a first portion of the sense component, the first portion of the sense component associated with a first voltage isolation characteristic, and coupling the memory cell with the sense component via the access line that by passes the differential amplifier may include operations, features, circuitry, means, or instructions for coupling the memory cell with a second portion of the sense component, the second portion of the sense component associated with a second voltage isolation characteristic that may be higher than the first voltage isolation characteristic.

Some examples of the method 900 and the apparatus described herein may further include operations, features, circuitry, means, or instructions for biasing a second input node of the differential amplifier with a ground voltage during the generating of the sense signal.

In some examples of the method 900 and the apparatus described herein, the second capacitor may have a capacitance that is non-linear with respect to voltage.

In some examples of the method 900 and the apparatus described herein, a current at the output node of the differential amplifier may be proportional to a difference between a voltage at the input node of the differential amplifier and a voltage at a second input node of the differential amplifier.

Some examples of the method 900 and the apparatus described herein may further include operations, features, circuitry, means, or instructions for biasing the memory cell while the memory cell is coupled with the access line.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory cell, and a differential amplifier having an input node configured to be coupled with the memory cell via an access line and having an output node coupled with the input node via a first capacitor. The apparatus may also include a second capacitor having a first node coupled with the input node and a second node configured to be coupled with a voltage source, and a sense component configured to determine a logic state stored by the memory cell based on sharing charge between the memory cell and the access line and between the second capacitor and the access line and based on the coupling of the output node with the input node.

Some examples of the apparatus may include a switching component to selectively couple the output node with the input node (e.g., via a direct feedback line).

Some examples of the apparatus may include a second switching component to selectively couple the sense component with the memory cell via an access line that bypasses the differential amplifier.

In some examples, the differential amplifier may be configured for a current at the output node that may be proportional to a difference between a voltage at the input node and a voltage at a second input node (e.g., as a transconductance differential amplifier).

In some examples, the differential amplifier may be configured for current to flow into the output node when a voltage at the input node is higher than a voltage of the second input node.

In some examples, the second capacitor may have a capacitance that is nonlinear with respect to voltage.

Some examples of the apparatus may include a ground voltage source configured to be coupled with a second input node of the differential amplifier.

Another apparatus is described. The apparatus may include a memory cell, a differential amplifier having a first input node, a second input node, and an output node that is coupled with the first input node via a first capacitor, a second capacitor coupled with the first input node. The apparatus may also include a controller configured to cause the apparatus to bias the first capacitor, couple the memory cell with the first input node, and generate, at the output node, a sense signal based at least in part on biasing the first capacitor and coupling the memory cell with the first input node. The apparatus may also include a sense component configured to determine a logic state stored by the memory cell based on a sense signal.

Some examples of the apparatus may include a switching component configured to connect the output node with the first input node before biasing the first capacitor and coupling the memory cell with the first input node, disconnect the output node from the first input node after the connecting and before biasing the first capacitor and coupling the memory cell with the access line.

Some examples of the apparatus may include a second voltage source configured to bias the access line with a ground voltage while the output node is connected with the first input node.

In some examples, to determine the logic state, the sense component may be configured to latch a difference between a signal at a first node of the sense component that is selectively coupled with the output node and a signal at a second node of the sense component.

In some examples, to determine the logic state, the sense component may be configured to couple the second node of the sense component with the first input node, and latch the difference between the signal at the first node of the sense component and the signal at the second node of the sense component after coupling the second node of the sense component with the first input node.

Some examples may further include performing a write operation on the memory cell, where the write operation includes coupling the memory cell with the sense component via an access line that bypasses the differential amplifier.

In some examples, the sense component may include a first portion configured to be coupled with the differential amplifier and associated with a first voltage isolation characteristic, and a second portion configured to be coupled with the memory cell via an access line that bypasses the differential amplifier and associated with a second voltage isolation characteristic that may be higher than the first voltage isolation characteristic.

Some examples of the apparatus may include a third voltage source configured to bias the second input node of the differential amplifier with a ground voltage during the generating of the sense signal.

In some examples, the second capacitor may have a capacitance that is non-linear with respect to voltage.

In some examples, the differential amplifier may be configured to support a current at the output node that is proportional to a difference between a voltage at the first input node and a voltage at the second input node (e.g., as a transconductance differential amplifier).

Some examples of the apparatus may include a voltage source configured to bias the memory cell while the memory cell is coupled with the first input node.

Some examples of the apparatus may include an access line coupling the memory cell with the differential amplifier, and the sense signal may be based on a first charge sharing between the second capacitor and the access line and a second charge sharing between the memory cell and the access line.

Information and signals described herein may be represented using any of a variety of different technologies and techniques. For examples data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal, however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of the memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less that the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limned to the examples and designs described herein but is to be accorded the broadest scope consistent with the principles and novel features disclosed herein.

What is claimed is:
1. An apparatus, comprising:
a capacitive element having a first node and a second node, wherein the capacitive element is configured to store an absolute value of charge that increases non-linearly as an absolute voltage between the first node and the second node increases;
a first transistor, wherein a gate of the first transistor and a source of the first transistor are connected to the first node and wherein a drain of the first transistor is connected to the second node; and
a second transistor, wherein a gate of the second transistor and a source of the second transistor are connected to the second node and wherein a drain of the second transistor is connected to the first node.

2. The apparatus of claim 1, wherein the gate of the first transistor is connected to the drain of the second transistor.

3. The apparatus of claim 2, wherein the capacitive element comprises a linear capacitor.

4. The apparatus of claim 1, wherein the drain of the first transistor is connected to the gate of the second transistor.

5. The apparatus of claim 4, wherein the capacitive element comprises a linear capacitor.

6. The apparatus of claim 1, wherein the capacitive element is configured to store a minimum of the absolute value of charge when the absolute voltage between the first node and the second node is equal to zero.

7. The apparatus of claim 6, wherein the capacitive element is configured to store a non-linearly positively increasing amount of charge as a voltage between the first node and the second node increases from zero.

8. The apparatus of claim 6, wherein the capacitive element is configured to store non-linearly negatively increasing amount of charge as a voltage between the first node and the second node decreases from zero.

9. A method, comprising:
storing a charge at a capacitive element having a first node and a second node, wherein an absolute value of the charge stored at the capacitive element increases non-linearly as an absolute voltage between the first node and the second node increases;
connecting a gate of a first transistor and a source of the first transistor to the first node and connecting a drain of the first transistor to the second node; and
connecting a gate of a second transistor and a source of the second transistor to the second node and connecting a drain of the second transistor to the first node.

10. The method of claim 9, further comprising:
connecting the gate of a first transistor to the drain of the second transistor; and
connecting the gate of the second transistor to the drain of the first transistor, wherein the capacitive element comprises a linear capacitor.

11. The method of claim 9, further comprising:
connecting the source of the first transistor to the drain of the first second transistor; and
connecting the drain of the first transistor to the source of the second transistor, wherein the capacitive element comprises a linear capacitor.

12. The method of claim 9, wherein the absolute value of charge stored at the capacitive element is at a minimum when the absolute voltage between the first node and the second node is equal to zero.

13. The method of claim 12, wherein an amount of charge stored at the capacitive element positively increases non-linearly as a voltage between the first node and the second node increases from zero.

14. The method of claim 12, wherein an amount of charge stored at the capacitive element negatively increases non-linearly as a voltage between the first node and the second node decreases from zero.

15. A capacitive circuit comprising:
an input;
an output;
a capacitive element having a first node connected to the input and a second node connected to the output;
a first transistor, wherein a source node of the first transistor and a gate node of the first transistor are connected to the input and wherein a drain node of the first transistor is connected to the output; and
a second transistor, wherein a drain node of the second transistor is connected to the input and a gate node of the second transistor and a source node of the second transistor are connected to the output, and wherein an absolute value of charge stored at the capacitive element increases non-linearly as an absolute voltage between the input and the output increases.

16. The capacitive circuit of claim 15, wherein the gate node of the first transistor is coupled with the drain node of the second transistor.

* * * * *